(12) United States Patent
Im et al.

(10) Patent No.: US 12,027,556 B2
(45) Date of Patent: Jul. 2, 2024

(54) IMAGE SENSOR AND METHOD FOR FABRICATING THE SAME

(71) Applicant: SAMSUNG ELECTRONICS CO., LTD., Suwon-si (KR)

(72) Inventors: Dong Mo Im, Seoul (KR); Ja Meyung Kim, Seoul (KR); Jong Eun Park, Suwon-si (KR); Beom Suk Lee, Seoul (KR); Kwan Sik Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 405 days.

(21) Appl. No.: 17/383,976

(22) Filed: Jul. 23, 2021

(65) Prior Publication Data
US 2022/0149088 A1    May 12, 2022

(30) Foreign Application Priority Data
Nov. 11, 2020 (KR) .................. 10-2020-0150002

(51) Int. Cl.
*H01L 27/146* (2006.01)
*H01L 27/148* (2006.01)

(52) U.S. Cl.
CPC .... *H01L 27/1463* (2013.01); *H01L 27/14603* (2013.01); *H01L 27/14636* (2013.01); *H01L 27/14643* (2013.01); *H01L 27/14685* (2013.01); *H01L 27/14831* (2013.01)

(58) Field of Classification Search
CPC ........... H01L 27/1463; H01L 27/14603; H01L 27/146; H01L 27/14616; H01L 29/4236; H01L 27/14614; H01L 21/28247; H01L 21/76834; H01L 21/28114; H01L 29/6653; H01L 29/66553; H01L 29/6656; H01L 29/66689; H01L 29/66719; H01L 29/4983; H01L 21/28132; H01L 21/2815; H01L 21/823468; H01L 21/823864
USPC ........................................................ 257/463
See application file for complete search history.

(56) References Cited

U.S. PATENT DOCUMENTS

| | | | |
|---|---|---|---|
| 9,420,209 B2 * | 8/2016 | Ahn ................... | H01L 27/1463 |
| 9,780,142 B1 * | 10/2017 | Koo .................. | H01L 27/14623 |
| 10,128,288 B2 | 11/2018 | Oh et al. | |
| 10,615,217 B2 | 4/2020 | Janssens et al. | |
| 2006/0124976 A1 * | 6/2006 | Adkisson .......... | H01L 27/14601 |
| | | | 257/E21.429 |

(Continued)

FOREIGN PATENT DOCUMENTS

KR    10-0192954    6/1999

*Primary Examiner* — Daniel Whalen
(74) *Attorney, Agent, or Firm* — F. Chau & Associates, LLC

(57) ABSTRACT

An image sensor includes a substrate, a photoelectric conversion region disposed inside the substrate, a first active region disposed inside the substrate to include a ground region, a floating diffusion region, and a channel region for connecting the ground region and the floating diffusion region, a substrate trench disposed inside the channel region, a transfer gate disposed on a face of the substrate to include a lower gate which fills a part of the substrate trench and has a first width, and an upper gate having a second width smaller than the first width on the lower gate, and a gate spacer disposed inside the substrate trench to be interposed between the ground region and the upper gate.

20 Claims, 23 Drawing Sheets

(56) References Cited

U.S. PATENT DOCUMENTS

| | | | |
|---|---|---|---|
| 2015/0243693 A1* | 8/2015 | Oh | H01L 27/14638 |
| | | | 257/292 |
| 2017/0287975 A1* | 10/2017 | Koo | H01L 27/14614 |
| 2019/0319047 A1* | 10/2019 | Uejima | H03K 19/018528 |
| 2019/0371845 A1 | 12/2019 | Chen et al. | |
| 2020/0058748 A1* | 2/2020 | Bae | H01L 27/0886 |
| 2020/0058790 A1* | 2/2020 | Chiang | H01L 21/76825 |
| 2020/0176500 A1 | 6/2020 | Sze et al. | |

* cited by examiner

IMAGE SENSOR AND METHOD FOR FABRICATING THE SAME

CROSS-REFERENCE TO RELATED APPLICATION

This non-provisional U.S. patent application claims priority under 35 U.S.C. § 119 from Korean Patent Application No. 10-2020-0150002 filed on Nov. 11, 2020 in the Korean Intellectual Property Office, the disclosure of which is incorporated by reference in its entirety herein.

1. TECHNICAL FIELD

The present disclosure relates to an image sensor. More specifically, the present disclosure relates to a complementary metal-oxide semiconductor (CMOS) type image sensor.

2. DISCUSSION OF RELATED ART

An image sensor is a sensor that detects and conveys information used to make an image. Image sensors are used in electronic imaging devices of both analog and digital types, which include digital cameras, camera modules, and smartphones. An image sensor may include semiconductor elements that convert optical information into an electric signal. The main two types of image sensors are a charge coupled device (CCD) image sensor, and a complementary metal-oxide semiconductor (CMOS) image sensor. The CCD and CMOS image sensors are based on metal-oxide-semiconductor (MOS) technology, with CCD sensors based on MOS capacitors and CMOS sensors based on MOS field-effect transistor amplifiers.

The image sensor may be configured in the form of a package that protects the image sensor and allows light to enter a photo receiving face or a sensing region of the image sensor.

SUMMARY

At least one embodiment of the present disclosure provides a more reliable image sensor.

At least one embodiment of the present disclosure provides a method for fabricating the image sensor.

According to an exemplary embodiment of the present disclosure, there is provided an image sensor including a substrate, a photoelectric conversion region disposed inside the substrate, a first active region disposed inside the substrate to include a ground region, a floating diffusion region, and a channel region for connecting the ground region and the floating diffusion region, a substrate trench disposed inside the channel region, a transfer gate disposed on a face of the substrate to include a lower gate which fills a part of the substrate trench and has a first width, and an upper gate having a second width smaller than the first width on the lower gate, and a gate spacer disposed inside the substrate trench to be interposed between the ground region and the upper gate.

According to an exemplary embodiment of the present disclosure, there is provided an image sensor including a substrate, a photoelectric conversion region disposed inside the substrate, a first active region disposed inside the substrate to include a ground region and a channel region, an element separation film disposed inside the substrate to surround the first active region without being interposed between the ground region and the channel region, a substrate trench disposed in the channel region, a transfer gate which fills at least a part of the substrate trench, a first gate trench disposed inside the transfer gate to be adjacent to the ground region, and a gate spacer disposed inside the first gate trench.

According to an exemplary embodiment of the present disclosure, there is provided an image sensor including a substrate, a photoelectric conversion region disposed inside the substrate, a first active region disposed inside the substrate to include a ground region, a floating diffusion region, and a channel region for connecting the ground region and the floating diffusion region, a second active region disposed inside the substrate to be separate from the first active region, an element separation film disposed inside the substrate to separate the first active region and the second active region, a transfer gate disposed on the channel region to include a lower gate buried in the substrate and having a first width, and an upper gate disposed on the lower gate having a second width smaller than the first width, a gate dielectric film interposed between the channel region and the transfer gate, and a gate spacer which extends along a side face of the upper gate. The ground region is separated from the upper gate by the gate dielectric film and the gate spacer.

According to an exemplary embodiment of the present disclosure, there is provided a method for fabricating an image sensor. The method includes: forming a substrate including a photoelectric conversion region; forming an element separation film defining a first active region in the substrate, the first active region including a ground region, an floating diffusion region, and a channel region connecting the ground region and the floating diffusion region; forming a substrate trench inside the channel region; forming a gate dielectric film extending along a side face and a lower face of the substrate trench; forming a preliminary gate conductive film on the gate dielectric film; patterning the preliminary gate conductive film to form a transfer gate including a lower gate for filling a part of the substrate trench and having a first width, and an upper gate having a second width smaller than the first width on the lower gate; and forming a gate spacer inside the substrate to be interposed between the ground region and the upper gate.

BRIEF DESCRIPTION OF THE DRAWINGS

The present disclosure will become more apparent by describing in detail example embodiments thereof referring to the attached drawings, in which.

DETAILED DESCRIPTION OF THE EXEMPLARY EMBODIMENTS

Hereinafter, an image sensor according to exemplary embodiments of the inventive concept will be described with reference to FIGS. 1 to 13.

Figure 1:
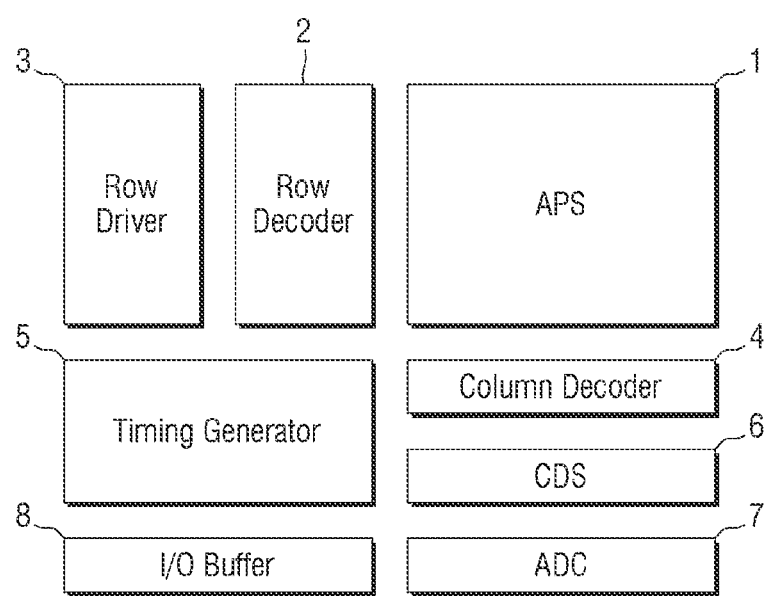
FIG. 1 is an example block diagram for explaining an image sensor according to an exemplary embodiment of the inventive concept.
Figure 2:
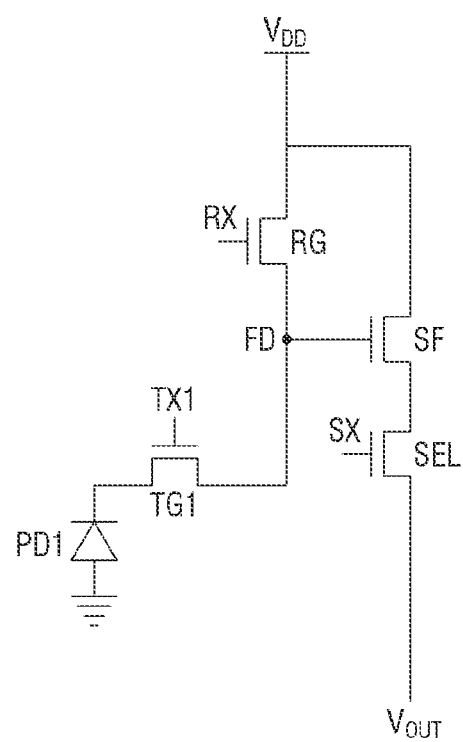
FIG. 2 is an example circuit diagram for explaining a unit pixel of the image sensor according to an exemplary embodiment of the inventive concept.

FIG. 1 is an example block diagram for explaining an image sensor according to an exemplary embodiment of the inventive concept. FIG. 2 is an example circuit diagram for explaining a unit pixel of the image sensor according to an exemplary embodiment of the inventive concept.

Referring to FIG. 1, the image sensor according to an exemplary embodiment includes an active pixel sensor array (APS) 1, a row decoder 2 (e.g., a decoder circuit), a row driver 3 (e.g., driver circuit), a column decoder 4 (e.g., a decoder circuit), a timing generator 5 (e.g., a timing controller, a timing circuit, etc.), a correlated double sampler (CDS) 6, an analog-to-digital converter (ADC) 7, and an input/output (I/O) buffer 8 (e.g., a I/O buffer circuit).

The active pixel sensor array 1 includes a plurality of unit pixels arranged two-dimensionally to convert an optical signal into an electric signal. The active pixel sensor array 1 may be driven by a plurality of drive signals, such as a pixel selection signal, a reset signal, and a charge transfer signal, from the row driver 3. Also, the electrical signal converted by the active pixel sensor array 1 may be provided to the correlated double sampler 6.

The row driver 3 may provide a large number of drive signals for driving a plurality of unit pixels to the active pixel sensor array 1 according to a result of a decoding performed by the row decoder 2. When the unit pixels are arranged in the form of a matrix, the drive signals may be provided for each row.

The timing generator 5 may provide a timing signal and a control signal to the row decoder 2 and the column decoder 4.

The correlated double sampler (CDS) 6 may receive, hold and sample the electrical signals generated by the active pixel sensor array 1. The correlated double sampler 6 may doubly sample a specific noise level and a signal level due to an electrical signal, and output a difference level corresponding to a difference between the noise level and the signal level.

The analog-to-digital converter (ADC) 7 may convert the analog signal corresponding to the difference level, which is output from the correlated double sampler 6, into a digital signal, and output the digital signal.

The I/O buffer 8 latches the digital signal, and the latched signal may be output sequentially to a video signal processing unit (not shown) according to a result of a decoding performed by the column decoder 4.

Referring to FIG. 2, each unit pixel may include a first photoelectric conversion element PD1, a first transfer transistor TG1, a floating diffusion region FD, a reset transistor RG, a source follower transistor SF, and a selection transistor SEL.

The first photoelectric conversion element PD1 may generate an electric charge in proportion to an amount of light incident from the outside. The first photoelectric conversion element PD1 may be coupled with the first transfer transistor TG1, which transfers the generated and accumulated electric charge to the floating diffusion region FD. Since the floating diffusion region FD is a region in which the electric charge is converted into a voltage, and has a parasitic capacitance, the electric charge may be accumulatively stored.

One end of the first transfer transistor TG1 may be connected to the first photoelectric conversion element PD1, and the other end of the first transfer transistor TG1 may be connected to the floating diffusion region FD. The first transfer transistor TG1 may be driven by a predetermined bias (e.g., a first transfer signal TX1). That is, the first transfer transistor TG1 may transfer the electric charge, which is generated from the first photoelectric conversion element PD1, to the floating diffusion region FD according to the first transfer signal TX1. For example, the first transfer transistor TG1 may transfer the electric charge when the first transfer signal TX1 applied to a gate of the first transfer transistor TG1 has a certain voltage level.

The source follower transistor SF may amplify a change in the electrical potential of the floating diffusion region FD to which the electric charge is transferred from the first photoelectric conversion element PD1 and output it to an output line $V_{OUT}$. When the source follower transistor SF is turned on, a predetermined electrical potential provided to a drain of the source follower transistor SF, for example, a power supply voltage $V_{DD}$, may be transferred to a drain region of the selection transistor SEL.

The selection transistor SEL may select a unit pixel to be read on a row basis. The selection transistor SEL may be driven by a selection line that applies a predetermined bias (e.g., a row selection signal SX). For example, the row selection signal SX may be applied to a gate of the selection transistor SEL to drive the selection transistor SEL.

The reset transistor RG may periodically reset the floating diffusion region FD. The reset transistor RG may be driven by a reset line that applies a predetermined bias (e.g., a reset signal RX). For example, the reset signal RX may be applied to a gate of the reset transistor RG to drive the reset transistor RX. When the reset transistor RG is turned on by the reset signal RX, a predetermined electrical potential provided to the drain of the reset transistor RG, for example, a power supply voltage $V_{DD}$, may be transferred to the floating diffusion region FD.

Figure 3:
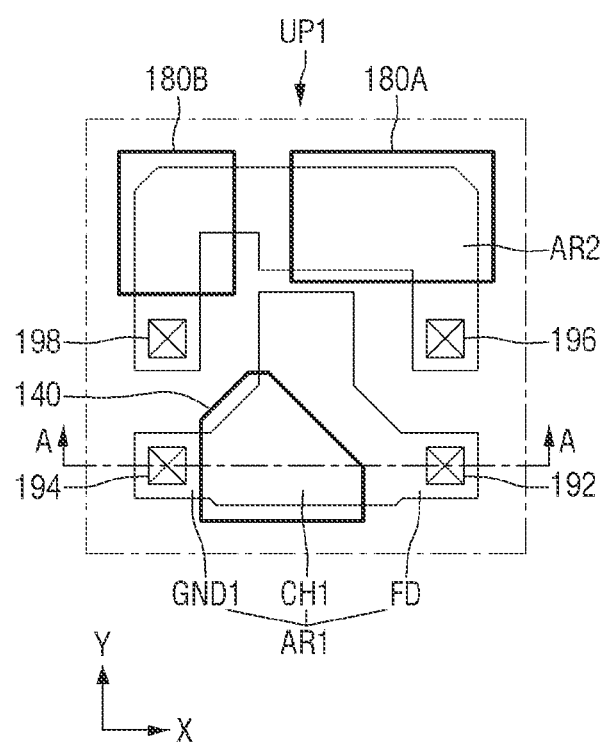
FIG. 3 is a layout diagram for explaining a unit pixel of an image sensor according to an exemplary embodiment of the inventive concept.

FIG. 3 is a layout diagram for explaining a unit pixel of an image sensor according to exemplary embodiment of the inventive concept. FIGS. 4 to 7 are various cross-sectional views taken along a line A-A of FIG. 3.

Figure 4:
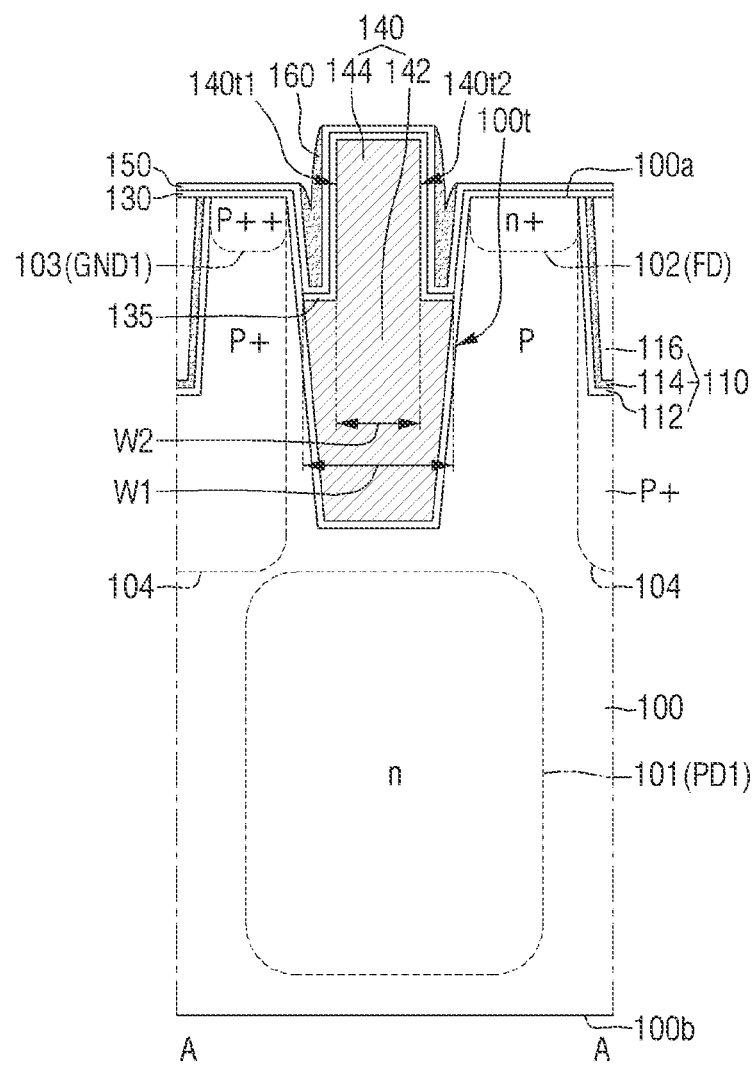
FIGS. 4 to 7 are various cross-sectional views taken along a line A-A of FIG. 3.

Referring to FIGS. 3 and 4, an image sensor according to an exemplary embodiment includes a first substrate 100, a photoelectric conversion region 101, a first active region AR1, an element separation film 110, a first transfer gate 140, a gate dielectric film 130, and a gate spacer 160.

In an embodiment, the first substrate 100 is a semiconductor substrate. For example, the first substrate 100 may be bulk silicon or silicon-on-insulator (SOI). The first substrate 100 may be a silicon substrate or may include other materials, for example, silicon germanium, indium antimonide, lead tellurium compounds, indium arsenic, indium phosphide, gallium arsenide or gallium antimonide. Alternatively, the first substrate 100 may have an epitaxial layer formed on a base substrate.

The first substrate 100 includes a first face 100a and a second face 100b that opposes the first face 100a. In the embodiments to be described below, the first face 100a may be referred to as a front side of the first substrate 100, and the second face 100b may be referred to as a back side of the first substrate 100. In some embodiments, the second face 100b of the first substrate 100 is a photo receiving face on which light is incident. That is, the image sensor according to some embodiments may be a back-illumination (BSI) image sensor.

In an embodiment, the first substrate 100 has a first conductive type. For example, the first substrate 100 may include p-type impurities (e.g., boron (B)). In the following examples, although the first conductive type will be described as a p-type, this is only an example, and the first conductive type may instead be an n-type.

A plurality of unit pixels may be formed on the first substrate 100. The plurality of unit pixels may be arranged in two dimensions (for example, in the form of a matrix) in a plane including, for example, a first direction X and a second direction Y. For convenience of explanation, one unit pixel (for example, a first unit pixel UP1) formed in the first substrate 100 will be mainly described below.

The photoelectric conversion region 101 may be formed inside the first substrate 100 of the first unit pixel UP1. The photoelectric conversion region 101 may correspond to the first photoelectric conversion element PD1 of FIG. 2. That is, the photoelectric conversion region 101 may generate the electric charge in proportion to the amount of light that is incident from the outside.

In an embodiment, the photoelectric conversion region 101 has a second conductive type different from the first conductive type. In the following examples, although the second conductive type will be described as an n-type, this is only an example, and the second conductive type may instead be a p-type. The photoelectric conversion region 101 may be formed, for example, by an ion-implantation of n-type impurities (for example, phosphorus (P) or arsenic (As)) into the p-type first substrate 100.

In an embodiment, the photoelectric conversion region 101 has a potential slope in a direction (e.g., a vertical direction) that intersects the first face 100a and the second face 100b of the first substrate 100. For example, the impurity concentration of the photoelectric conversion region 101 may decrease from the first face 100a toward the second face 100b.

In an embodiment, a first active region AR1 and a second active region AR2 are located inside the first unit pixel UP1. In an embodiment, the first active region AR1 and the second active region AR2 are formed inside the first substrate 100 on the photoelectric conversion region 101. In an embodiment, the first active region AR1 and the second active region AR2 are adjacent to the first face 100a of the first substrate 100. For example, the first active region AR1 and the second active region AR2 may each extend from the first face 100a of the first substrate 100.

In an embodiment, the first active region AR1 and the second active region AR2 are separated or spaced apart from each other. For example, the first active region AR1 and the second active region AR2 may be separated by the element separation film 110.

In an embodiment, the element separation film 110 is located inside the first substrate 100. The element separation film 110 may be formed, for example, by burying an insulating material in a shallow trench formed by patterning the first substrate 100. In an embodiment, the element separation film 110 is adjacent to the first face 100a of the first substrate 100. For example, the element separation film 110 may extend from the first face 100a of the first substrate 100. In an embodiment, the element separation film 110 surrounds each of the first active region AR1 and the second active region AR2. Therefore, the element separation film 110 may define the first active region AR1 and the second active region AR2.

In an exemplary embodiment, the element separation film 110 is formed of multi-films or includes multiple films. For example, the element separation film 110 may include an insulating liner 112, an etching blocking liner 114, and a gapfill insulating film 116, which are stacked sequentially. The insulating liner 112 may conformally extend along a profile of a side face and a lower face of a shallow trench formed by patterning the first substrate 100. The etching blocking liner 114 may be formed on the insulating liner 112. The etching blocking liner 114 may extend conformally along the profile of the insulating liner 112. The gapfill insulating film 116 may be formed on the etching blocking liner 114. The gapfill insulating film 116 may fill the region of the shallow trench that remains after the insulating liner 112 and the etching blocking liner 114 are formed. For example, the gapfill insulating film 116 may entirely fill the region.

The insulating liner 112, the etching blocking liner 114, and the gapfill insulating film 116 may each include, but is not limited to, for example, at least one of silicon oxide, silicon nitride, silicon oxynitride, and a combination thereof.

In an exemplary embodiment, the etching blocking liner 114 includes a material having an etching selectivity with respect to the insulating liner 112 and the gapfill insulating film 116. For example, when the insulating liner 112 and the gapfill insulating film 116 include silicon oxide, the etching blocking liner 114 may include at least one of silicon nitride, silicon carbonitride, silicon oxycarbonitride, and a combination thereof. As an example, the insulating liner 112 and the gapfill insulating film 116 may include silicon oxide, and the etching blocking liner 114 may include silicon nitride.

The first active region AR1 includes a first ground region GND1, a first channel region CH1, and a floating diffusion region FD.

The first ground region GND1 may be formed in the first substrate 100 of the first active region AR1. In an embodiment, the first ground region GND1 has the first conductive type. In an embodiment, the first ground region GND1 has the first conductive type at a higher impurity concentration than the first substrate 100. For example, the first ground region GND1 may be a second impurity region 103 formed by ion-implantation of a high concentration of p-type impurities (p++) into the p-type first substrate 100.

In an embodiment, a ground voltage is applied to the first ground region GND1. For example, as shown in FIG. 3, a first ground contact 194 connected to the first ground region GND1 may be formed. The first ground contact 194 may provide a ground voltage to the first ground region GND1. For example, a voltage generator may be present to apply the ground voltage to the first ground contact 194.

The floating diffusion region FD may be formed in the first substrate 100 of the first active region AR1. In an embodiment, the floating diffusion region FD is separated from the first ground region GND1. In an embodiment, a first layer that makes up the floating diffusion FD region is separate and distinct from a second layer that makes up the first ground region GND1. In an embodiment, the floating diffusion region FD has the second conductive type. For example, the floating diffusion region FD may be the first impurity region 102 formed by ion-implantation of n-type impurities into the p-type first substrate 100.

In an embodiment, the floating diffusion region FD has the second conductive type at a higher impurity concentration than the photoelectric conversion region 101. For example, the floating diffusion region FD may be formed by ion-implantation of a high concentration of n-type impurities (n+) into the p-type first substrate 100.

The first channel region CH1 may be formed inside the first substrate 100 of the first active region AR1. In an embodiment, the first channel region CH1 is located between the photoelectric conversion region 101 and the floating diffusion region FD. In an embodiment, the first channel region CH1 has the first conductive type. For example, the first channel region CH1 may be a part of the p-type first substrate 100.

In an embodiment, the first channel region CH1 is connected to the first ground region GND1. For example, the element separation film 110 is not interposed between the first channel region CH1 and the first ground region GND1. In an embodiment, the first channel region CH1 connects the first ground region GND1 and the floating diffusion region FD. In an embodiment, the first ground region GND1, the first channel region CH1, and the floating diffusion region FD may be connected to form an integral first active region AR1.

In an embodiment, the first channel region CH1 protrudes from the first ground region GND1 and the floating diffusion region FD toward the second active region AR2. In an exemplary embodiment, as shown in FIG. 3, the first active region AR1 has a T-shape from a planar viewpoint.

In an embodiment, a well region 104 is located inside the first unit pixel UP1. The well region 104 may be formed inside the first substrate 100 on the photoelectric conversion region 101. The well region 104 may be adjacent to the first face 100a of the first substrate 100. For example, the well region 104 may extend from the first face 100a of the first substrate 100. In an embodiment, the well region 104 is formed to be deeper than the first ground region GND1 and the floating diffusion region FD.

In an embodiment, the well region 104 has the first conductive type. In an embodiment, the well region 104 has the first conductive type at an impurity concentration higher than the first substrate 100. For example, the well region 104 may be formed by ion-implantation of a high concentration of p-type impurities (p+) into the p-type first substrate 100. In an embodiment, the well region 104 has the first conductive type at an impurity concentration lower than the first ground region GND1.

In an embodiment, the well region 104 surrounds the first channel region CH1 from a planar viewpoint. For example, the well region 104 may be formed by ion-implantation of p-type impurities (p+) into the first substrate 100 except the first channel region CH1. In an embodiment, the well region 104 overlaps the first ground region GND1 and the floating diffusion region FD.

In an embodiment, the first transfer gate 140 is formed on the first face 100a of the first substrate 100. In an embodiment, the first transfer gate 140 is formed on the first active region AR1. In an embodiment, the first transfer gate 140 is formed on the first substrate 100 between the photoelectric conversion region 101 and the floating diffusion region FD.

The first transfer gate 140 may correspond to the gate electrode of the first transfer transistor TG1 of FIG. 2. For example, the first transfer gate 140 may define a first channel region CH1 inside the first substrate 100. For example, the first channel region CH1 may be formed inside the first substrate 100 below the first transfer gate 140. When the first transfer gate 140 is turned on, the electric charge generated from the photoelectric conversion region 101 is transferred to the floating diffusion region FD through the first channel region CH1.

In an embodiment, the first transfer gate 140 is a vertical transfer gate. That is, at least a part of the first transfer gate 140 may be buried in the first substrate 100. In an embodiment, a substrate trench 100t extending from the first face 100a of the first substrate 100 is formed inside the first substrate 100. At least a part of the first transfer gate 140 may be formed to fill the substrate trench 100t. Thus, the lower face of the first transfer gate 140 may be formed to be lower than the first face 100a of the first substrate 100.

In an embodiment, the width of the substrate trench 100t decreases as it goes away from the first face 100a of the first substrate 100 towards the second face 100b. This may be attributed to the characteristics of the etching process for forming the substrate trench 100t.

The first transfer gate 140 may include, but is not limited to, for example, at least one of polysilicon (poly Si) doped with impurities, metal silicide such as cobalt silicide, metal nitride such as titanium nitride, and metals such as tungsten, copper and aluminum. As an example, the first transfer gate 140 may include a polysilicon film.

In an embodiment, the first transfer gate 140 includes a lower gate 142 and an upper gate 144.

The lower gate 142 may fill a part (lower part) of the substrate trench 100t. In an embodiment, a side face of the lower gate 142 forms an acute angle with the upper face of the lower gate 142. For example, since the width of the substrate trench 100t may decrease as it goes away from the first face 100a of the first substrate 100, the first width W1 of the lower gate 142 may also decrease as it goes away from the first face 100a of the first substrate 100.

In an embodiment, the upper gate 144 is located above the lower gate 142. The upper gate 144 may have a shape protruding from the upper face of the lower gate 142. In an embodiment, the upper gate 144 protrudes from the first face 100a of the first substrate 100.

In an embodiment, a second width W2 of the upper gate 144 is smaller than the first width W1 of the lower gate 142. In an embodiment, a first gate trench 140t1 and a second gate trench 140t2 are formed inside the first transfer gate 140. The first gate trench 140t1 and the second gate trench 140t2 may be defined by the upper face of the lower gate 142, the side face of the upper gate 144, and the side face of the substrate trench 100t, respectively.

In an embodiment, the first gate trench 140t1 is adjacent to the first ground region GND1. For example, the first gate trench 140t1 may expose a side face of the first active region AR1 on which the first ground region GND1 is formed. Therefore, the first ground region GND1 may be separated from the upper gate 144 by the first gate trench 140t1.

In an embodiment, the second gate trench 140t2 is adjacent to the floating diffusion region FD. For example, the second gate trench 140t2 may expose a side face of the first active region AR1 on which the floating diffusion region FD is formed. Although the width and depth of the second gate trench 140t2 are shown as only being the same as the width and depth of the first gate trench 140t1, this is only an example. For example, the width and depth of the second gate trench 140t2 may be different from the width and depth of the first gate trench 140t1.

In an embodiment, the gate dielectric film 130 is interposed between the first transfer gate 140 and the first substrate (100, or the first channel region CH1). For example, the gate dielectric film 130 may conformally extend along the profiles of the side face and the lower face of the substrate trench 100t. The first transfer gate 140 may be formed on the gate dielectric film 130 to fill at least a part of the substrate trench 100*t*. In an embodiment, the gate dielectric film 130 further extends along the first face 100*a* of the first substrate 100.

The gate dielectric film 130 may include, but is not limited to, for example, at least one of silicon oxide, silicon nitride, silicon oxynitride and a low dielectric constant (low-k) material) having a lower dielectric constant than silicon oxide. The low dielectric constant material may include, for example, at least one of FOX (Flowable Oxide), TOSZ (Torene SilaZene), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material, and a combination thereof. As an example, the gate dielectric film 130 may include a silicon oxide film.

In an embodiment, the gate spacer 160 is formed on the first transfer gate 140. The gate spacer 160 may be formed on the upper face of the lower gate 142 and the side face of the upper gate 144. For example, the gate spacer 160 may be formed inside the first gate trench 140*t*1. In an embodiment, the gate spacer 160 is interposed between the first ground region GND1 and the upper gate 144. In an embodiment, the first ground region GND1 is separated from the upper gate 144 by the gate spacer 160. In an embodiment, the first ground region GND1 is separated from the upper gate 144 by the gate dielectric film 130 and the gate spacer 160.

In some embodiments, the gate spacer 160 may be formed inside the second gate trench 140*t*2. In an embodiment, the gate spacer 160 is interposed between the floating diffusion region FD and the upper gate 144.

In an embodiment, a first insulating film 135 is further formed on the first transfer gate 140. The first insulating film 135 may conformally extend, for example, along the profiles of the upper face of the lower gate 142, and the side face and the upper face of the upper gate 144. In an embodiment, the first insulating film 135 is formed by oxidizing the surface of the first transfer gate 140. As an example, the first insulating film 135 may include a silicon oxide film.

In an embodiment, a second insulating film 150 is further formed on the first insulating film 135. The second insulating film 150 may extend, for example, conformally along the profiles of the gate dielectric film 130 and the first insulating film 135. The second insulating film 150 may include, but is not limited to, for example, at least one of silicon oxide, silicon nitride, silicon oxynitride and a low dielectric constant (low-k) material having a lower dielectric constant than silicon oxide. As an example, the second insulating film 150 may include USG (Undoped Silicate Glass).

In an embodiment, the first ground region GND1 is separated from the upper gate 144 by the gate dielectric film 130, the second insulating film 150 and the gate spacer 160.

In an embodiment, a source follower gate 180A and a selection gate 180B are formed on the second active region AR2. Although not shown, the source follower gate 180A and the selection gate 180B may be formed on the first face 100*a* of the first substrate 100.

The source follower gate 180A may correspond to the gate electrode of the source follower transistor SF of FIG. 2. For example, as shown in FIG. 3, a first floating diffusion contact 192 connected to the floating diffusion region FD may be formed. Also, a first power contact 196 connected to the second active region AR2 on one side of the source follower gate 180A may be formed. In an embodiment, the source follower gate 180A amplifies and outputs a change in electrical potential of the floating diffusion region FD through the first floating diffusion contact 192. As an example, when the source follower gate 180A is turned on, a predetermined electrical potential (e.g., $V_{DD}$ of FIG. 2) provided from the first power contact 196 may be transferred to the second active region AR2 between the other side of the source follower gate 180A and one side of the selection gate 180B.

The selection gate 180B may correspond to the gate electrode of the selection transistor SEL of FIG. 2. For example, as shown in FIG. 3, an output contact 198 connected to the second active region AR2 on the other side of the selection gate 180B may be formed. When the first unit pixel UP1 is selected as the unit pixel to be read on a row basis, the predetermined electrical potential provided from the source follower gate 180A may be output to the output line (e.g., $V_{OUT}$ of FIG. 2) through the output contact 198.

In an embodiments, both ends of the second active region AR2 protrude toward the first active region AR1. For example, as shown in FIG. 3, the second active region AR2 may have a U shape from a planar viewpoint.

In an embodiments, the first power contact 196 is connected to one end of a second active region AR2 protruding toward the first active region AR1, and the output contact 198 is connected to the other end of the second active region AR2 protruding toward the first active region AR1.

With an increasingly high integration of the image sensor, an aspect ratio (AR) of the active regions defined by a element separation film inside the unit pixel gradually increases. This induces a leaning phenomenon of the active regions or a pattern shift of the active regions, which causes a degradation of reliability of the image sensor. As an example, a ground region formed by being isolated from other active regions (channel regions, floating diffusion region, and the like) may be formed inside the unit pixel. The ground region formed by being isolated in this way has a high aspect ratio, and therefore, induces a leaning phenomenon or a pattern shift, which causes a degradation of the reliability of the image sensor.

However, since the image sensor according to at least one embodiment of the inventive concept includes the first active region AR1 provided integrally by connecting the first ground region GND1, the first channel region CH1, and the floating diffusion region FD, it is possible to provide an image sensor having improved reliability. Specifically, as described above, since the first ground region GND1 may be separated from the upper gate 144 by the gate spacer 160, the first channel region CH1 may be provided, while being connected to the first ground region GND1. As a result, since the leaning phenomenon or the pattern shift of the first ground region GND1 is prevented, an image sensor with improved reliability can be provided.

Further, since the image sensor according to at least one embodiment may prevent the leaning phenomenon or the pattern shift of the first ground region GND1, a smaller first ground region GND1 can be provided. This enables miniaturization of the unit pixel and improves the process margin, thereby providing an extra space for other electronic elements (e.g., the first transfer gate 140 or the like) placed inside the first unit pixel UP1. This makes it possible to provide an image sensor with improved performance in a miniaturized structure.

Figure 5:
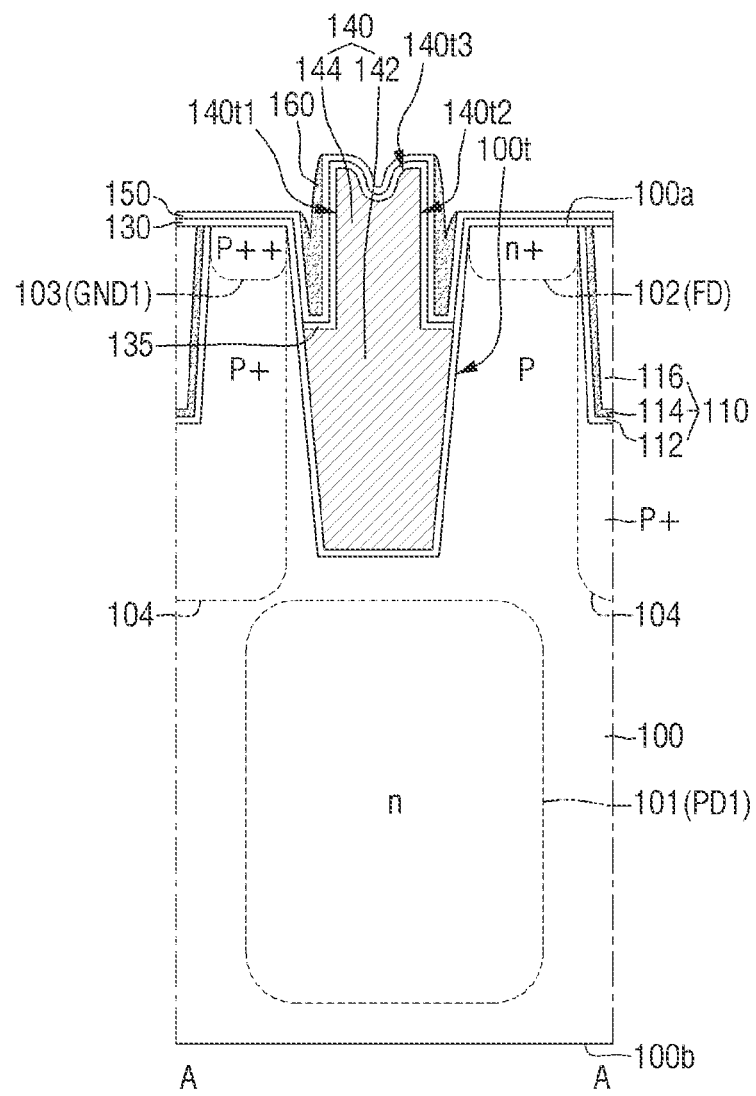

Referring to FIGS. 3 and 5, in the image sensor according to an exemplary embodiment, the first transfer gate 140 includes a recess 140*t*3 or a depression.

The recess 140t3 may be formed inside the upper face of the upper gate 144. The recess 140t3 may have a recessed shape toward the first substrate 100. This may be due to the characteristics of the vapor deposition process for forming the first transfer gate 140 that fills at least a part of the substrate trench 100t.

In an embodiment, each of the first insulating film 135 and the second insulating film 150 conformally extend along the profile of the recess 140t3.

Figure 6:
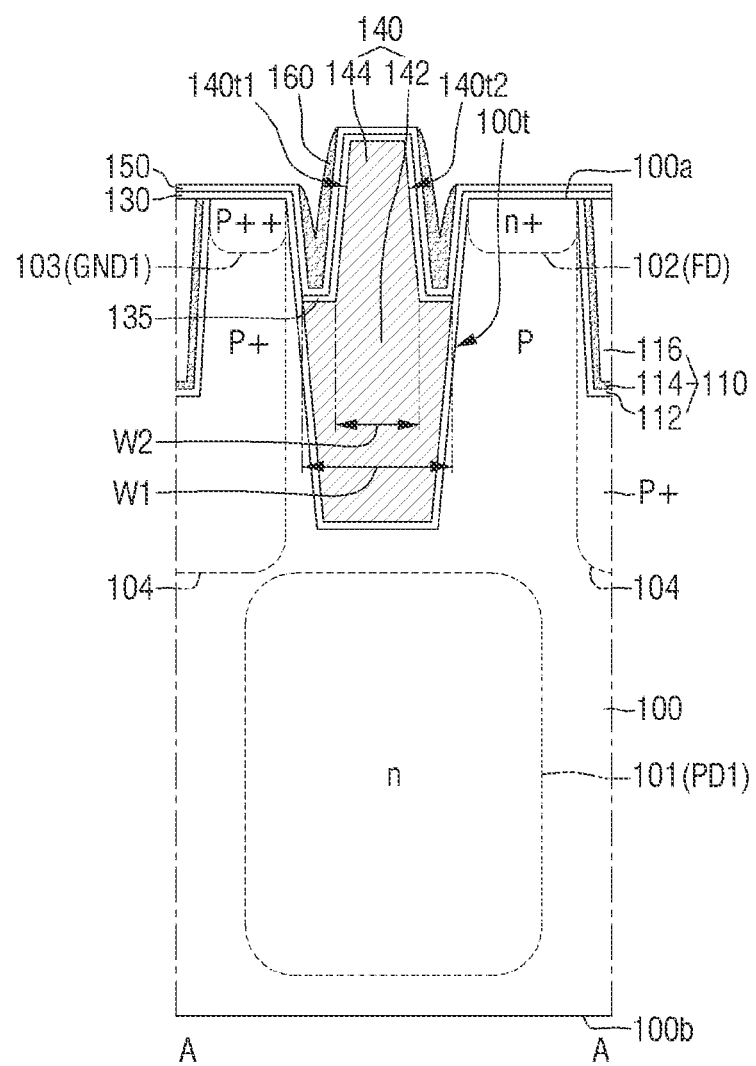

Referring to FIGS. 3 and 6, in an image sensor according to an exemplary embodiment, the side face of the upper gate 144 forms an acute angle with the upper face of the lower gate 142.

For example, a second width W2 of the upper gate 144 may decrease as it goes away from the lower gate 142. This may be due to the characteristics of the etching process for forming the first gate trench 140t1 and/or the second gate trench 140t2.

Figure 7:
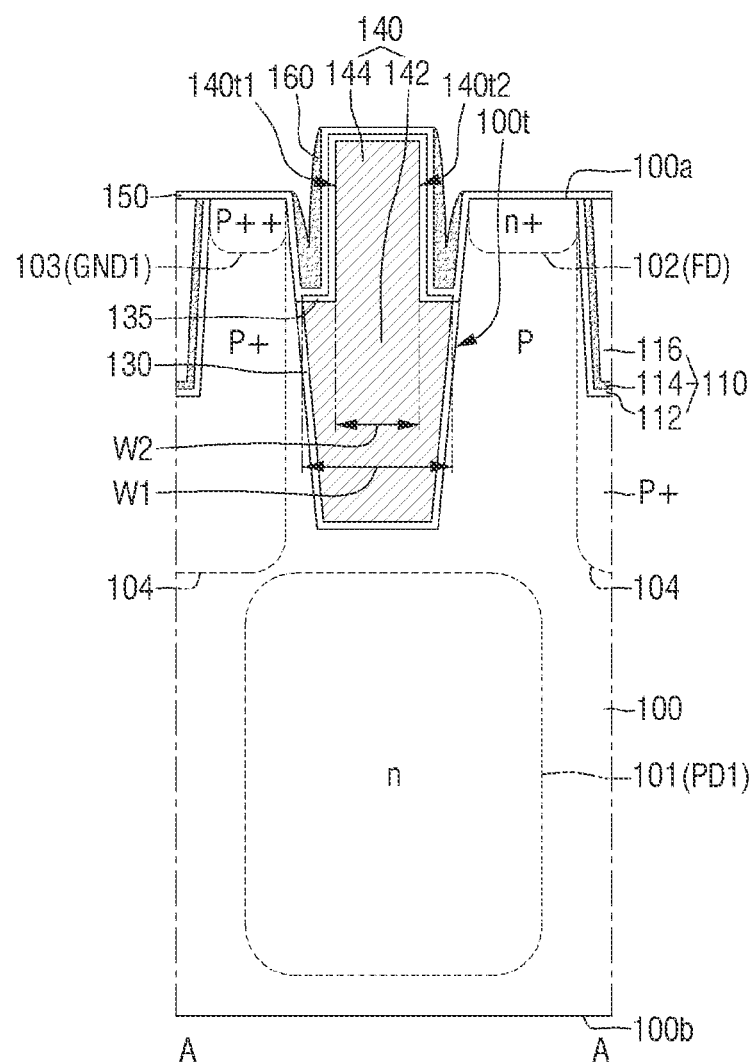

Referring to FIGS. 3 and 7, in the image sensor according to an exemplary embodiment, the gate dielectric film 130 extends along a part of a side face of the substrate trench 100t.

For example, the gate dielectric film 130 is interposed between the first substrate (100, or first channel region CH1) and the lower gate 142, and is not interposed between the first substrate 100 and the gate spacer 160.

In an embodiment, the second insulating film 150 is formed on the gate dielectric film 130 and the first insulating film 135, and extends along the other part of the side face of the substrate trench 100t. In an embodiment, the second insulating film 150 further extends along the first face 100a of the first substrate 100. In an embodiment, the second insulating film 150 is in contact with the first substrate 100. In an embodiment, the first ground region GND1 is separated from the upper gate 144 by the second insulating film 150 and the gate spacer 160.

Figure 8:
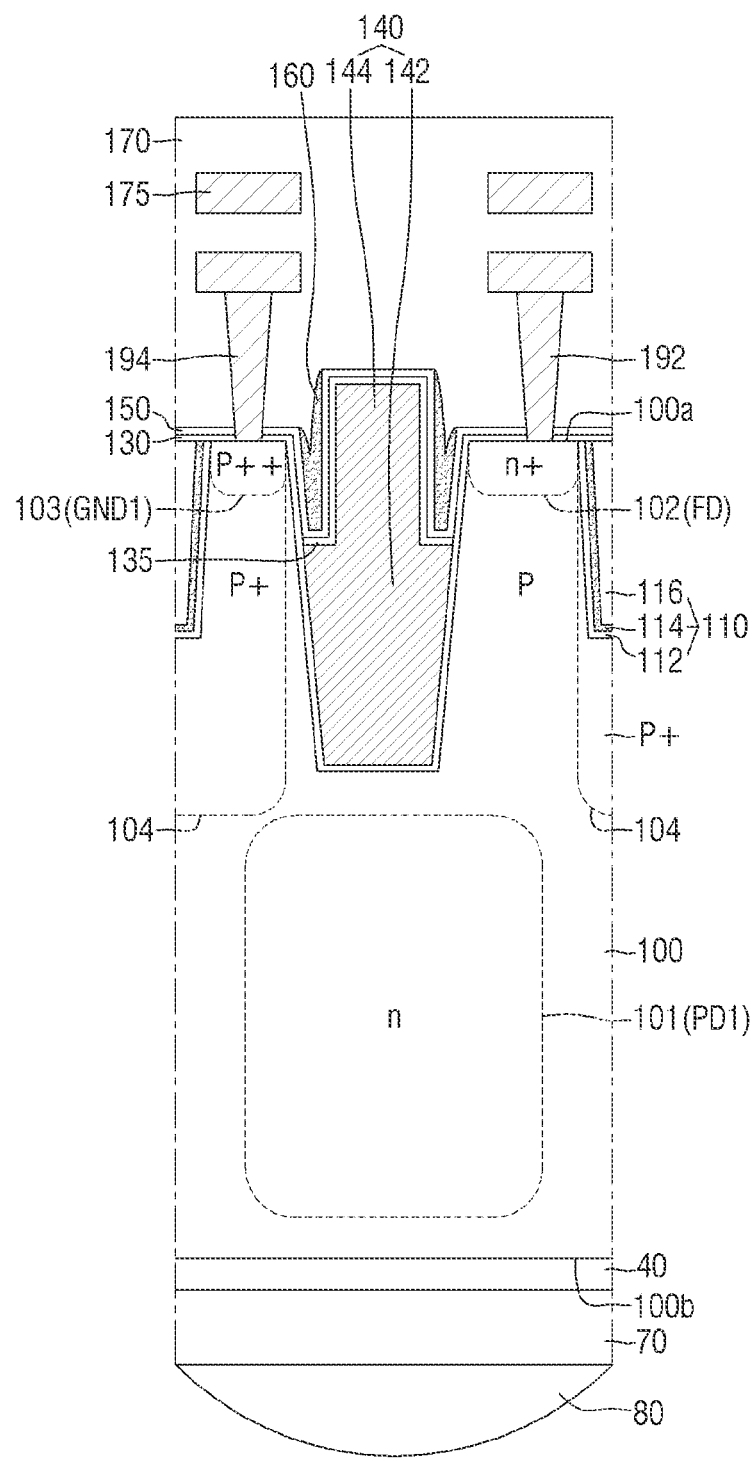
FIG. 8 is a cross-sectional view for explaining the image sensor according to an exemplary embodiment of the inventive concept.

FIG. 8 is a cross-sectional view for explaining the image sensor according to an exemplary embodiment. For convenience of explanation, repeated parts of contents explained above using FIGS. 1 to 7 will be briefly described or omitted.

Referring to FIG. 8, an image sensor according to an exemplary embodiment further includes a surface insulating film 40, a color filter 70, a microlens 80, a first inter-wiring insulating film 170, and a plurality of first wirings 175.

The surface insulating film 40 may be formed on the second face 100b of the first substrate 100. The surface insulating film 40 may include, but is not limited to, for example, at least one of silicon oxide, silicon nitride, silicon oxynitride, aluminum oxide, hafnium oxide, and a combination thereof.

In an embodiment, the surface insulating film 40 is formed of multi-films or multiple films. For example, the surface insulating film 40 may include, but is not limited to, an aluminum oxide film, a hafnium oxide film, a silicon oxide film, a silicon nitride film and a hafnium oxide which are sequentially stacked on the second face 100b of the first substrate 100.

The surface insulating film 40 may function as a flattening film to form a color filter 70 and a microlens 80 at a uniform height. Further, the surface insulating film 40 may function as an antireflection film to prevent reflection of light that is incident on the first substrate 100, thereby improving the photo receiving rate of the photoelectric conversion region 101.

The color filter 70 may be formed on the surface insulating film 40. The color filter 70 may be arranged to correspond to each unit pixel. For example, a plurality of color filters 70 may be arranged two-dimensionally (for example, in the form of a matrix).

The color filter 70 may have various colors depending on the unit pixel. For example, the color filter 70 may be arranged in the form of a bayer pattern that includes a red color filter, a green color filter, and a blue color filter. However, this is only an example, and the color filter 70 may include a yellow filter, a magenta filter, and a cyan filter, and may also further include a white filter.

The microlens 80 may be formed on the color filter 70. The microlens 80 may be arranged to correspond to each unit pixel. For example, a plurality of microlenses 80 may be arranged two-dimensionally (for example, in the form of a matrix).

The microlens 80 have a convex shape and may have a predetermined radius of curvature. The microlens 80 may concentrate light that is incident on the photoelectric conversion region 101. The microlens 80 may include, but is not limited to, for example, a light-transmitting resin.

The first inter-wiring insulating film 170 may be formed on the first face 100a of the first substrate 100. The first inter-wiring insulating film 170 may cover the first transfer gate 140. For example, the first inter-wiring insulating film 170 may cover the gate spacer 160 and the second insulating film 150.

The plurality of first wirings 175 may be formed in the first inter-wiring insulating film 170. The plurality of first wirings 175 may connect various electronic elements (for example, the first active region AR1, the second active region AR2, the first transfer gate 140, the source follower gate 180A, the selection gate 180B, and the like) formed inside the unit pixel (for example, the first unit pixel UP1) to each other. In FIG. 8, the number of layers and the arrangement of the first wiring 175 are only examples.

In an embodiment, the first floating diffusion contact 192 is formed inside the first inter-wiring insulating film 170 and connects the floating diffusion region FD and a part of the first wirings 175. For example, the first floating diffusion contact 192 extends from a part of the first wirings 175, and may penetrate the second insulating film 150 and the gate dielectric film 130 to be connected to the floating diffusion region FD. In an embodiment, the first floating diffusion contact 192 has a tapered shape so that its width gradually decreases towards the floating diffusion region.

In an embodiment, the first ground contact 194 is formed inside the first inter-wiring insulating film 170 and connects the first ground region GND1 and the other part of the first wirings 175. For example, the first ground contact 194 extends from the other part of the first wirings 175, and may penetrate the second insulating film 150 and the gate dielectric film 130 to be connected to the first ground region GND1. In an embodiment, the first ground contact 194 has a tapered shape so that its width gradually decreases towards the first ground region GND1.

Figure 9:
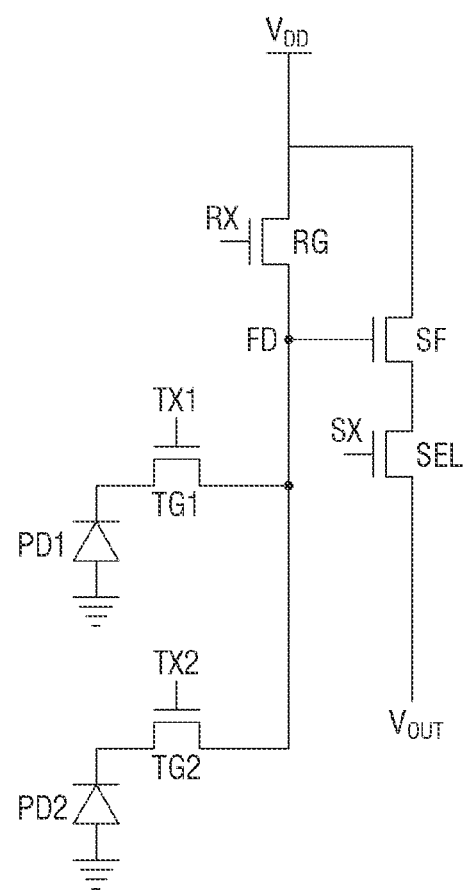
FIG. 9 is an example circuit diagram for explaining an image sensor according to an exemplary embodiment of the inventive concept.
Figure 10:
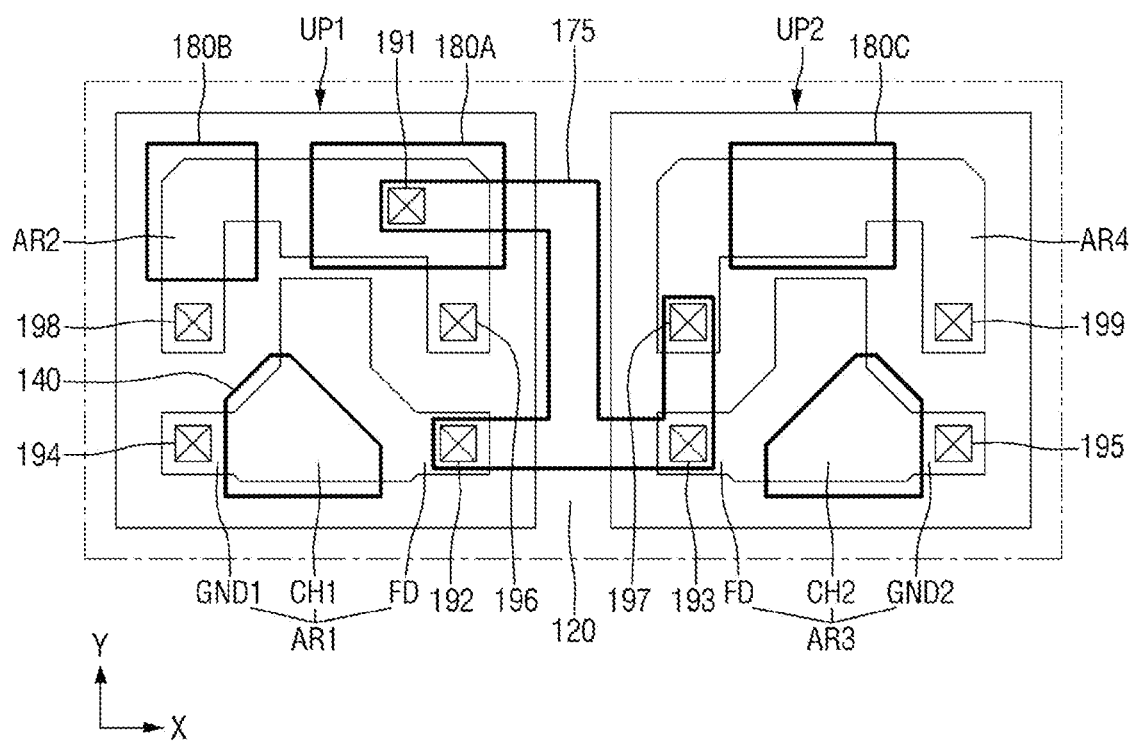
FIGS. 10 and 11 are various layout views for explaining an image sensor according to an exemplary embodiment of the inventive concept.
Figure 11:
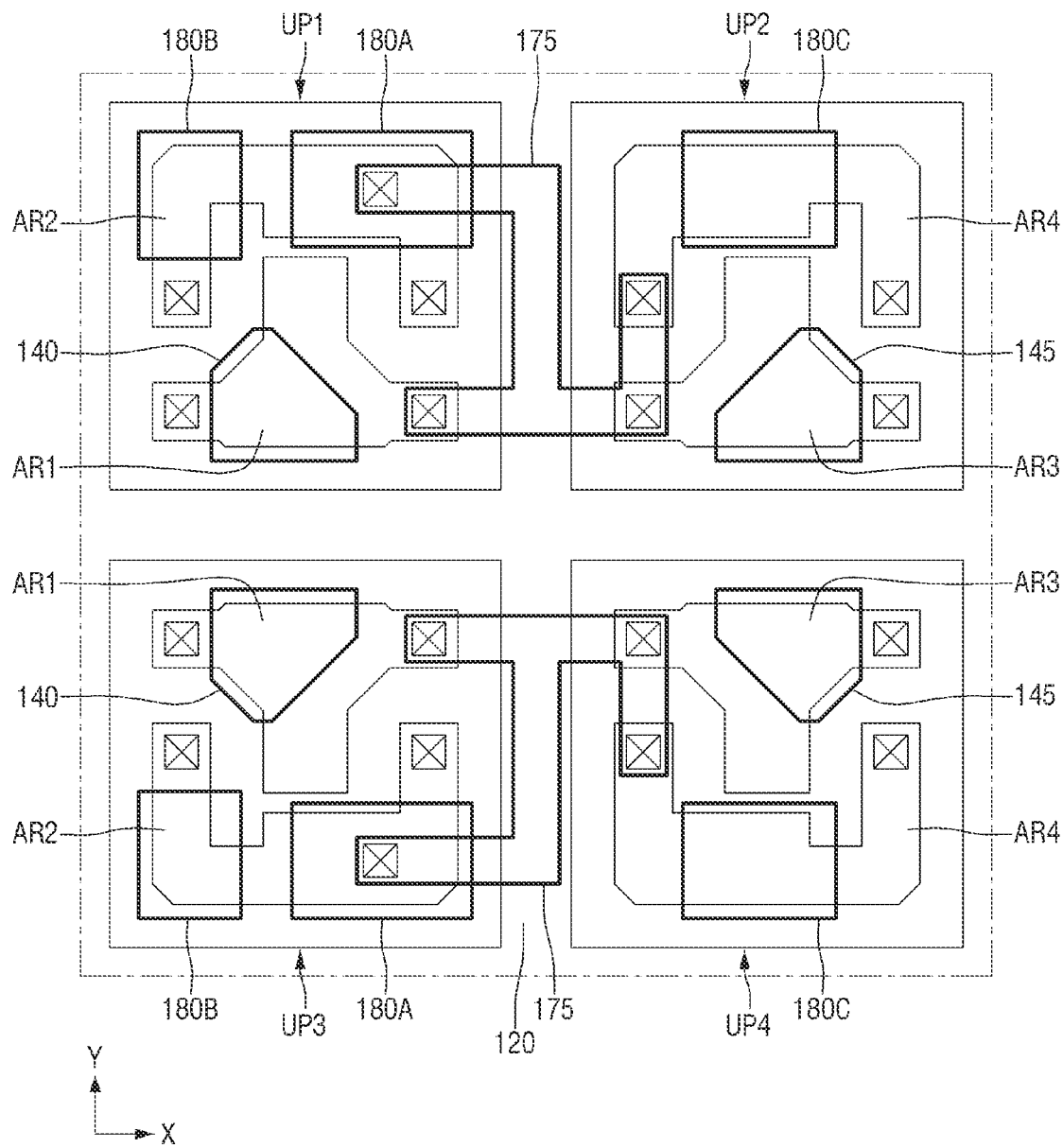

FIG. 9 is an example circuit diagram for explaining an image sensor according to an exemplary embodiment of the inventive concept. FIGS. 10 and 11 are various layout views for explaining the image sensor according to an exemplary embodiment. For convenience of explanation, repeated parts of contents explained above using FIGS. 1 to 8 will be briefly explained or omitted.

Referring to FIG. 9, the image sensor according to an exemplary embodiment further includes a second photoelectric conversion element PD2 and a second transfer transistor TG2.

The second photoelectric conversion element PD2 may generate the electric charge in proportion to the amount of light incident from the outside. The second photoelectric conversion element PD2 may be coupled with the second transfer transistor TG2 that transfers the generated and accumulated electric charge to the floating diffusion region FD.

One end of the second transfer transistor TG2 may be connected to the second photoelectric conversion element PD2, and the other end of the second transfer transistor TG2 may be connected to the floating diffusion region FD. The second transfer transistor TG2 may be driven by a predetermined bias (e.g., a second transfer signal TX2). That is, the second transfer transistor TG2 may transfer the electric charge generated from the second photoelectric conversion element PD2 to the floating diffusion region FD according to the second transfer signal TX2.

In an embodiment, the first transfer transistor TG1 and the second transfer transistor TG2 share the floating diffusion region FD.

Referring to FIG. 10, the image sensor according to an exemplary embodiment further includes a second unit pixel UP2.

In an embodiment, a third active region AR3 and a fourth active region AR4 are formed in the second unit pixel UP2. The third active region AR3 may include a second ground region GND2, a second channel region CH2, and a floating diffusion region FD. Since the third active region AR3 is similar to the first active region AR1, and the fourth active region AR4 is similar to the second active region AR2, detailed explanation will not be provided below.

In an embodiment, the first unit pixel UP1 and the second unit pixel UP2 are separated from each other. For example, the first unit pixel UP1 and the second unit pixel UP2 may be separated by the pixel separation film 120.

The pixel separation film 120 may be formed inside the first substrate 100. The pixel separation film 120 may be formed, for example, by burying an insulating material inside a deep trench formed by patterning the first substrate 100. In an embodiment, the pixel separation film 120 surrounds or encapsulates each of the first unit pixel UP1 and the second unit pixel UP2. Therefore, the pixel separation film 120 may define the first unit pixel UP1 and the second unit pixel UP2.

In an embodiment, the first unit pixel UP1 and the second unit pixel UP2 are symmetrically formed around the pixel separation film 120 interposed between them. For example, the first active region AR1 and the third active region AR3 may be arranged symmetrically around the pixel separation film 120 between the first unit pixel UP1 and the second unit pixel UP2. The second active region AR2 and the fourth active region AR4 may be arranged symmetrically around the pixel separation film 120 between the first unit pixel UP1 and the second unit pixel UP2.

In an embodiment, a ground voltage is applied to the second ground region GND2. For example, a second ground contact 195 connected to the second ground region GND2 may be formed. The second ground contact 195 may provide a ground voltage to the second ground region GND2.

In an embodiment, the first unit pixel UP1 and the second unit pixel UP2 share the floating diffusion region FD. For example, the floating diffusion region FD of the first active region AR1 and the floating diffusion region FD of the third active region AR3 may be connected to one another. As an example, a second floating diffusion contact 193 connected to the floating diffusion region FD of the third active region AR3 may be formed. Also, a first wiring 175 which connects the first floating diffusion contact 192 and the second floating diffusion contact 193 may be formed.

In an embodiment, the first wiring 175 is connected to a source follower gate 180A. As an example, a source follower contact 191 connected to the source follower gate 180A may be formed. As a result, the source follower gate 180A may amplify a change in the electrical potential of the floating diffusion region FD through the first wiring 175 to generate an amplified signal, and output the amplified signal.

In an embodiment, a second transfer gate 145 and a reset gate 180C are placed inside the second unit pixel UP2.

The second transfer gate 145 may be formed on the third active region AR3. The second transfer gate 145 may correspond to the gate electrode of the second transfer transistor TG2 of FIG. 9. In an embodiment, the second transfer gate 145 is a vertical transfer gate. Since the second transfer gate 145 may be similar to the first transfer gate 140, a detailed explanation thereof will not be provided below.

The reset gate 180C may be formed on the fourth active region AR4. The reset gate 180C may correspond to a gate electrode of the reset transistor RG of FIG. 9. For example, a second power contact 199 connected to the fourth active region AR4 of one side of the reset gate 180C may be formed. For example, when the fourth active region AR4 has a U-shape, the second power contact 199 may be formed on an end of one leg of the U-shape. Also, a reset contact 197 connected to the fourth active region AR4 of the other side of the reset gate 180C may be formed. For example, when the fourth active region AR4 has a U-shape, the reset contact 197 may be formed on an end of another leg of the U-shape. The reset gate 180C may periodically reset the floating diffusion region FD of the first active region AR1 and the floating diffusion region FD of the third active region AR3 through the reset contact 197. As an example, the reset contact 197 may be connected to the first floating diffusion contact 192 and the second floating diffusion contact 193 through the first wiring 175. When the reset gate 180C is turned on, a predetermined electrical potential (e.g., $V_{DD}$ of FIG. 9) provided from the second power contact 199 may be transferred to the floating diffusion region FD through the reset contact 197.

Referring to FIG. 11, the image sensor according to an exemplary embodiment further includes a third unit pixel UP3 and a fourth unit pixel UP4.

A first active region AR1 and a second active region AR2 are formed inside the third unit pixel UP3. A third active region AR3 and a fourth active region AR4 are formed inside the fourth unit pixel UP4. Since the third unit pixel UP3 may be similar to the first unit pixel UP1, and the fourth unit pixel UP4 may be similar to the second unit pixel UP2, a detailed explanation thereof will not be provided below.

In an embodiment, the first unit pixel UP1 and the third unit pixel UP3 are formed symmetrically around the pixel separation film 120 interposed between them. The second unit pixel UP2 and the fourth unit pixel UP4 are formed symmetrically around the pixel separation film 120 interposed between them.

Figure 12:
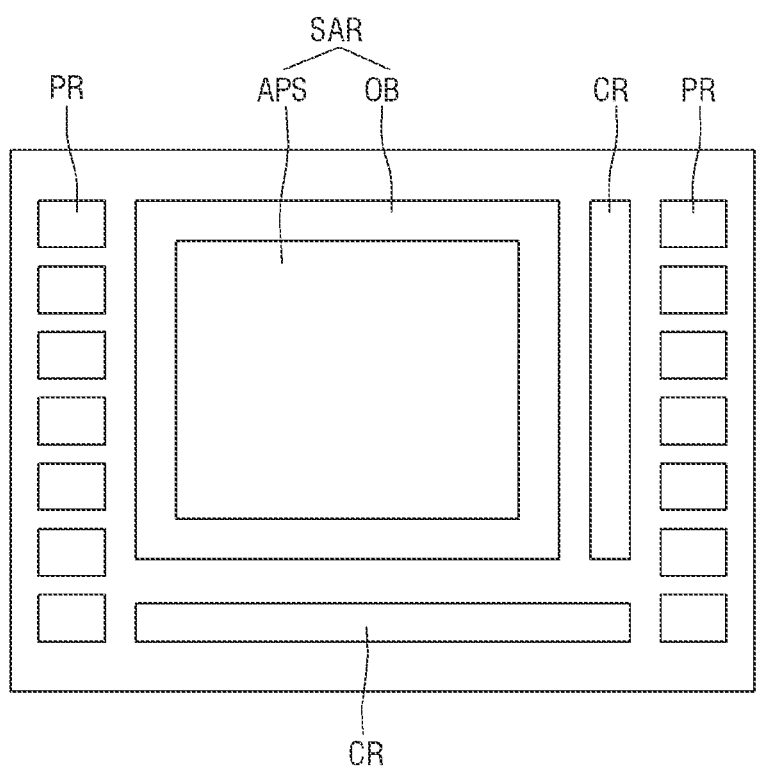
FIG. 12 is an example layout diagram for explaining an image sensor according to an exemplary embodiment of the inventive concept.
Figure 13:
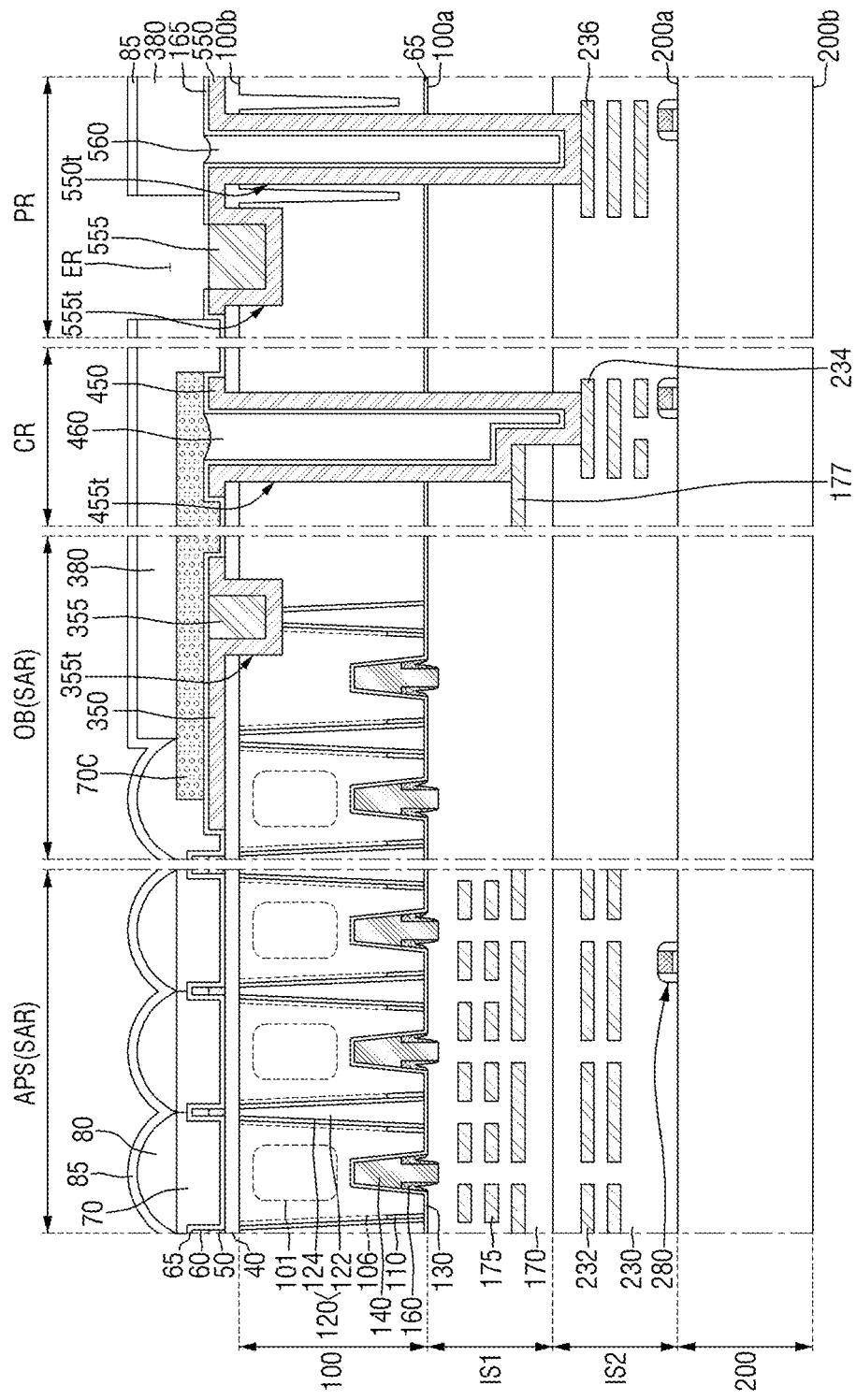
FIG. 13 is a schematic cross-sectional view for explaining the image sensor of FIG. 12.

FIG. 12 is an example layout diagram for explaining an image sensor according to an exemplary embodiment of the inventive concept. FIG. 13 is a schematic cross-sectional view for explaining the image sensor of FIG. 12. For convenience of explanation, repeated parts of contents explained above using FIGS. 1 to 11 will be briefly described or omitted.

Referring to FIG. 12, the image sensor according to an embodiment includes a sensor array region SAR, a connection region CR, and a pad region PR.

The sensor array region SAR may include a region corresponding to the active pixel sensor array 1 of FIG. 1. For example, a plurality of unit pixels arranged two-dimensionally (for example, in the form of a matrix) may be formed in the sensor array region SAR.

In an embodiment, the sensor array region SAR includes a photo receiving region APS and a photo shielding region OB. The active pixels that receive light and generate an active signal may be arranged inside the photo receiving region APS. Optical black pixels that block light and generate an optical black signal may be arranged in the photo shielding region OB. In an embodiment, the photo shielding region OB has a frame shape. Although the photo shielding region OB may be formed, for example, along the periphery of the photo receiving region APS, this is only an example.

In some examples, the photoelectric conversion region 101 is not formed in a part of the photo shielding region OB. For example, the photoelectric conversion region 101 may be formed in the first substrate 100 of the light shielding region OB adjacent to the photo receiving region APS, and not formed in the first substrate 100 of the photo shielding region OB separated from the photo receiving region APS.

In some embodiments, dummy pixels (not shown) are formed in the photo receiving region APS adjacent to the photo shielding region OB.

The connection region CR may be formed around the sensor array region SAR. Although the connection region CR may be formed on one side of the sensor array region SAR, this is only an example. The wirings are formed in the connection region CR, and may be configured to transmit and receive electrical signals of the sensor array region SAR.

A pad region PR may be formed around the sensor array region SAR. Although the pad region PR may be formed to be adjacent to the edge of the image sensor according to some embodiments, this is only an example. The pad region PR may be configured to be connected to an external device or the like to transmit and receive electrical signals between the image sensor according to some embodiments and the external device.

In FIG. 12, although the connection region CR is shown as being interposed between the sensor array region SAR and the pad region PR, this is only an example. The placement of the sensor array region SAR, the connection region CR and the pad region PR may vary as needed.

Referring to FIG. 13, the image sensor according to an exemplary embodiment includes a first substrate 100, a first wiring structure IS1, a second substrate 200, and a second wiring structure IS2.

The first wiring structure IS1 is formed on the first substrate 100. In an embodiment, the first wiring structure IS1 covers the first face 100a of the first substrate 100.

The first wiring structure IS1 includes a first inter-wiring insulating film 170, and a plurality of wirings 175 and 177 in the first inter-wiring insulating film 170. In FIG. 13, the number of layers of wirings that constitute the first wiring structure IS1 and the arrangement thereof are only examples and are not limited thereto.

In an embodiment, the first wiring structure IS1 includes a first wiring 175 in the sensor array region SAR, and a second wiring 177 in the connection region CR. The first wiring 175 may be electrically connected to the unit pixels of the sensor array region SAR. For example, the first wiring 175 may be connected to the first substrate 100. The second wiring 177 may extend from the sensor array region SAR. For example, the second wiring 177 may be electrically connected to at least a part of the first wiring 175. Therefore, the second wiring 177 may be electrically connected to the unit pixel of the sensor array region SAR.

In an embodiment, the second substrate 200 is a semiconductor substrate. For example, the second substrate 200 may be bulk silicon or SOI. The second substrate 200 may be a silicon substrate or may include other materials, for example, silicon germanium, indium antimonide, lead tellurium compounds, indium arsenic, indium phosphide, gallium arsenide or gallium antimonide. Alternatively, the second substrate 200 may have an epitaxial layer formed on the base substrate.

In an embodiment, the second substrate 200 includes a third face 200a and a fourth face 200b that opposes the third face 200a. The third face 200a of the second substrate 200 may face the first face 100a of the first substrate 100.

A plurality of electronic elements may be formed on the second substrate 200. For example, a peripheral circuit element 280 may be formed on the third face 200a of the second substrate 200. The peripheral circuit element 280 is electrically connected to the sensor array region SAR and may transmit and receive electrical signals to and from each unit pixel of the sensor array region SAR. For example, the peripheral circuit element 280 may include the electronic elements that constitute the row decoder 2, the row driver 3, the column decoder 4, the timing generator 5, the correlated double sampler 6, the analog-to-digital converter 7 or the I/O buffer 8 of FIG. 1.

A second wiring structure IS2 may be formed on the second substrate 200. In an embodiment, the second wiring structure IS2 covers the third face 200a of the second substrate 200. The second wiring structure IS2 may be attached to the first wiring structure IS1. For example, the upper face of the second wiring structure IS2 may be attached to the lower face of the first wiring structure IS1.

In an embodiment, the second wiring structure IS2 includes a second inter-wiring insulating film 230, and a plurality of wirings 232, 234, and 236 in the second inter-wiring insulating film 230. In FIG. 13, the number of layers of wirings that constitute the second wiring structure IS2, and the arrangement thereof are only examples and are not limited thereto.

In an embodiment, the second wiring structure IS2 includes a third wiring 232 in the sensor array region SAR, a fourth wiring 234 in the connection region CR, and a fifth wiring 236 in the pad region PR. In an embodiment, the fourth wiring 234 is an uppermost wiring among the plurality of wirings in the connection region CR, and the fifth wiring 236 is an uppermost wiring among the plurality of wirings in the pad region PR.

In an embodiment, grid patterns 50 and 60 are formed between the color filters 70. The grid patterns 50 and 60 may be formed on the surface insulating film 40 of the photo receiving region APS. The grid patterns 50 and 60 are formed in a grid shape from a planar viewpoint, and may be interposed between the color filters 70. In an embodiment, the grid patterns 50 and 60 are placed to overlap the pixel separation film 120 of the photo receiving region APS.

In an embodiment, the grid patterns 50 and 60 include a metal pattern 50 and a low refractive index pattern 60. The metal pattern 50 and the low refractive index pattern 60 may be stacked sequentially, for example, on the surface insulating film 40.

The metal pattern 50 may include a conductive material. For example, the metal pattern 50 may include, but is not limited to, at least one of titanium (Ti), titanium nitride (TiN), tantalum (Ta), tantalum nitride (TaN), tungsten (W), aluminum (Al), copper (Cu), and combinations thereof.

The low refractive index pattern 60 may include a low refractive index material with a refractive index lower than silicon (Si). For example, the low refractive index pattern 60 may include, but is not limited to, at least one of silicon oxide, aluminum oxide, tantalum oxide, and a combination thereof. The low refractive index pattern 60 may improve the light collection efficiency by refracting or reflecting obliquely incident light, and may improve the quality of the image sensor.

In an embodiment, a first connection structure 350 is formed inside the photo shielding region OB. The first connection structure 350 may be formed on the surface insulating film 40 of the photo shielding region OB. In an embodiment, the first connection structure 350 is in contact with the pixel separation film 120. For example, a first trench 355*t* that exposes the pixel separation film 120 may be formed in the first substrate 100 and the surface insulating film 40 of the photo shielding region OB. The first connection structure 350 may be formed in the first trench 355*t* and be in contact with the pixel separation film 120 inside the photo shielding region OB. In an embodiment, the first connection structure 350 extends along the profile of a side face and a lower face of the first trench 355*t*.

In an embodiment, the first connection structure 350 is formed at the same level as the metal pattern 50. In an embodiment, the first connection structure 350 and the metal pattern 50 are formed by a same fabricating process. For example, the first connection structure 350 may be made up of the same material as the metal pattern 50.

The first connection structure 350 may include, but is not limited to, for example, at least one of titanium (Ti), titanium nitride (TiN), tantalum (Ta), tantalum nitride (TaN), tungsten (W), aluminum (Al), copper (Cu) and combinations thereof.

In an embodiment, the first connection structure 350 is electrically connected to the pixel separation film 120 and applies a ground voltage or a negative voltage to the pixel separation film 120. For example, the pixel separation film 120 may include a conductive filling pattern 122 and an insulating spacer film 124. The first connection structure 350 may be electrically connected to the conductive filling pattern 122. The insulating spacer film 124 may electrically separate the conductive filling pattern 122 from the first substrate 100. Accordingly, it is possible to effectively prevent an electrostatic discharge (ESD) bruise defect of the image sensor. Here, the ESD bruise defect means a phenomenon in which the electric charges generated by ESD are accumulated on the first substrate 100 to cause a bruise-like stain to be generated on the image.

In an embodiment, a potential barrier layer 106 extending along side faces of the pixel separation film 120 are formed inside the first substrate 100. In an embodiment, the potential barrier layer 106 has the second conductive type. For example, the potential barrier layer 106 may be formed by ion-implantation of n-type impurities into the p-type first substrate 100. The potential barrier layer 106 may reduce dark current to improve the quality of the image sensor according to an exemplary embodiment. For example, the potential barrier layer 106 may reduce occurrence of dark current due to an electron-hole pair (EHP) generated from the surface defects of the pixel separation film 120.

In an embodiment, a first pad 355 that fills the first trench 355*t* is formed on the first connection structure 350. Although the first pad 355 may include, but is not limited to, for example, at least one of tungsten (W), copper (Cu), aluminum (Al), gold (Au), silver (Ag), and alloys thereof.

In an embodiment, a first protective film 65 is formed on the surface insulating film 40 and the first connection structure 350. For example, the first protective film 65 may extend conformally along profiles of the surface insulating film 40, the grid patterns 50 and 60, the first connection structure 350, and the first pad 355.

The first protective film 65 may include, but is not limited to, for example, aluminum oxide. The first protective film 65 may prevent damage to the surface insulating film 40 and the grid patterns 50 and 60.

In an embodiment, a second protective film 85 is formed on the microlens 80. The second protective film 85 may extend along the surface of the microlens 80. The second protective film 85 may include, for example, an inorganic oxide film. For example, the second protective film 85 may include, but is not limited to, at least one of silicon oxide, titanium oxide, zirconium oxide, hafnium oxide, and a combination thereof. As an example, the second protective film 85 may include a low temperature oxide (LTO).

The second protective film 85 containing the inorganic oxide film may protect the microlens 80 including an organic material from the outside. Also, the second protective film 85 may improve the quality of the image sensor by improving the light collection efficiency of the microlens 80. For example, the second protective film 85 may reduce reflection, refraction, and scattering of the incident light that reaches the space between the microlenses 80, by filling the space between the microlenses 80.

In an embodiment, a second connection structure 450 is formed in the connection region CR. The second connection structure 450 may be formed on the surface insulating film 40 of the connection region CR. In an embodiment, the second connection structure 450 electrically connects the first wiring structure IS1 and the second wiring structure IS2. For example, a second trench 455*t* that exposes the second wiring 177 and the fourth wiring 234 may be formed in the first substrate 100, the first wiring structure IS1, the second substrate 200, and the second wiring structure IS2 of the connection region CR. The second connection structure 450 may be formed in the second trench 455*t*, and connect the second wiring 177 and the fourth wiring 234. In an embodiment, the second connection structure 450 extends along the profile of the side face and the lower face of the second trench 455*t*.

The second connection structure 450 may include, but is not limited to, for example, at least one of titanium (Ti), titanium nitride (TiN), tantalum (Ta), tantalum nitride (TaN), tungsten (W), aluminum (Al), copper (Cu), and combinations thereof. In an embodiment, the second connection structure 450 is formed at the same level as the first connection structure 350. For example, the first connection structure 350 and the second connection structure 450 may be formed by a same fabricating process. For example, the first connection structure 350 and the second connection structure 450 may include the same material.

In an embodiment, the first protective film 65 covers the second connection structure 450. For example, the first protective film 65 may extend along the profile of the second connection structure 450.

In an embodiment, a first filling insulating film 460 that fills the second trench 455*t* is formed on the second connection structure 450. The first filling insulating film 460 may include, but is not limited to, for example, at least one of silicon oxide, aluminum oxide, tantalum oxide, and a combination thereof.

In an embodiment, a third connection structure 550 is formed inside the pad region PR. The third connection structure 550 may be formed on the surface insulating film 40 of the pad region PR. The third connection structure 550 may electrically connect the second wiring structure IS2 to an external device or the like.

For example, a third trench 550t that exposes the fifth wiring 236 may be formed in the first substrate 100, the first wiring structure IS1, the second substrate 200 and the second wiring structure IS2 of the pad region PR. The third connection structure 550 is formed in the third trench 550t and may be in contact with the fifth wiring 236. Further, a fourth trench 555t may be formed in the first substrate 100 of the pad region PR. The third connection structure 550 may be formed in the fourth trench 555t and exposed. In an embodiment, the third connection structure 550 extends along the profiles of the side faces and the lower faces of the third trench 550t and the fourth trench 555t.

The third connection structure 550 may include, but is not limited to, for example, at least one of titanium (Ti), titanium nitride (TiN), tantalum (Ta), tantalum nitride (TaN), tungsten (W), aluminum (Al), copper (Cu), and combinations thereof. In an embodiment, the third connection structure 550 is formed at the same level as the first connection structure 350 and the second connection structure 450. In an embodiment, the third connection structure 550 and the first connection structure 350 are formed by a same process. For example, the third connection structure 550 and the first connection structure 350 include a same material.

In an embodiment, a second filling insulating film 560 that fills the third trench 550t is formed on the third connection structure 550. The second filling insulating film 560 may include, but is not limited to, for example, at least one of silicon oxide, aluminum oxide, tantalum oxide, and a combination thereof. In an embodiment, the second filling insulating film 560 is formed at the same level as the first filling insulating film 460. In an embodiment, the second filling insulating film 560 and the first filling insulating film 460 are formed by a same process. For example, the second filling insulating film 560 and the first filling insulating film 460 may include a same material.

In an embodiment, a second pad 555 that fills the fourth trench 555t is formed on the third connection structure 550. The second pad 555 may include, but is not limited to, for example, at least one of tungsten (W), copper (Cu), aluminum (Al), gold (Au), silver (Ag), and alloys thereof. In an embodiment, the second pad 555 is formed at the same level as the first pad 355. In an embodiment, the second pad 555 and the first pad 355 are formed by a same process. For example, the second pad 555 and the first pad 355 may include a same material.

In an embodiment, the first protective film 65 covers the third connection structure 550. For example, the first protective film 65 may extend along the profile of the third connection structure 550. In an embodiment, the first protective film 65 exposes the second pad 555.

In an embodiment, a photo shielding filter 70C is formed on the first connection structure 350 and the second connection structure 450. For example, the photo shielding filter 70C may be formed to cover a part of the first protective film 65 inside the photo shielding region OB and the connection region CR. The photo shielding filter 70C may include, but is not limited to, for example, a blue color filter.

In an embodiment, a third protective film 380 is formed on the photo shielding filter 70C. For example, the third protective film 380 may be formed to cover a part of the first protective film 65 inside the light shielding region OB, the connection region CR, and the pad region PR. In an embodiment, the second protective film 85 extends along the surface of the third protective film 380. The third protective film 380 may include, but is not limited to, for example, a light-transmitting resin. In an embodiment, the third protective film 380 includes the same material as the microlens 80.

In an embodiment, the second protective film 85 and the third protective film 380 expose the second pad 555. For example, an upper surface of the second pad 555 is not covered by the second protective film 85 or the third protective film 380. For example, an exposure opening ER that exposes the second pad 555 may be formed in the second protective film 85 and the third protective film 380. Accordingly, the second pad 555 may be connected to an external device or the like, and may be configured to transmit and receive an electrical signal between the image sensor and the external device according to an embodiment.

Hereinafter, a method for fabricating an image sensor according to an exemplary embodiment of the inventive concept will be described referring to FIGS. 3, 4, and 14 to 20.

FIGS. 14 to 20 are intermediate stage diagrams for explaining the method for fabricating the image sensor according to some embodiments. For convenience of explanation, repeated parts of contents explained above using FIGS. 1 to 13 will be briefly described or omitted.

Figure 14:
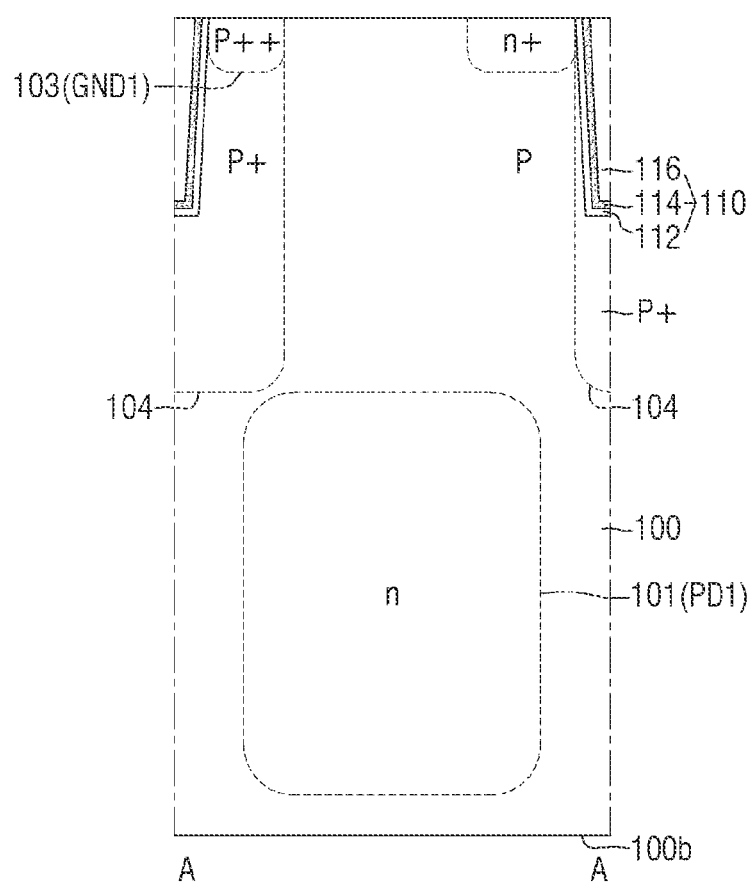
FIGS. 14 to 20 are intermediate stage diagrams for explaining a method for fabricating the image sensor according to an exemplary embodiment of the inventive concept.

Referring to FIGS. 3 and 14, a first substrate 100 including a photoelectric conversion region 101 is provided or formed.

The first substrate 100 may include a first face 100a and a second face 100b that opposes the first face 100a. In an embodiment, the first substrate 100 has a first conductive type (e.g., a p-type).

The photoelectric conversion region 101 may be formed in the first substrate 100. In an embodiment, the photoelectric conversion region 101 has a second conductive type (e.g., an n-type) different from the first conductive type.

A first active region AR1 and a second active region AR2 are formed in the first substrate 100. The first active region AR1 and the second active region AR2 may be separated by an element separation film 110. In some embodiments, the element separation film 110 is formed of multi-films or multiple films. For example, the element separation film 110 may include an insulating liner 112, an etching blocking liner 114 and a gapfill insulating film 116, which are stacked sequentially.

The first active region AR1 may include a first ground region GND1, a first channel region CH1, and a floating diffusion region FD. In an embodiments, the first ground region GND1 has the first conductive type at a higher impurity concentration than the first substrate 100. The floating diffusion region FD may be separated from the first ground region GND1. The floating diffusion region FD may have the second conductive type. The first channel region CH1 may be formed between the photoelectric conversion region 101 and the floating diffusion region FD. The first channel region CH1 may have the first conductive type.

In an embodiment, the first channel region CH1 may be connected to the first ground region GND1. For example, the element separation film 110 is not interposed between the first channel region CH1 and the first ground region GND1. The first channel region CH1 may connect the first ground region GND1 and the floating diffusion region FD. In an embodiment, the first ground region GND1, the first channel region CH1 and the floating diffusion region FD are connected to form an integral first active region AR1. Accordingly, since the leaning phenomenon or the pattern shift of the first ground region GND1 is prevented, it is possible to provide a method for fabricating an image sensor having improved reliability.

In an embodiment, a well region 104 is further formed inside the first substrate 100. In an embodiment, the well region 104 is formed to be deeper than the first ground region GND1 and the floating diffusion region FD.

Formation of the first ground region GND1, the first channel region CH1, the floating diffusion region FD and the well region 104 may be performed by, but is not limited to, for example, an ion implantation process.

Figure 15:
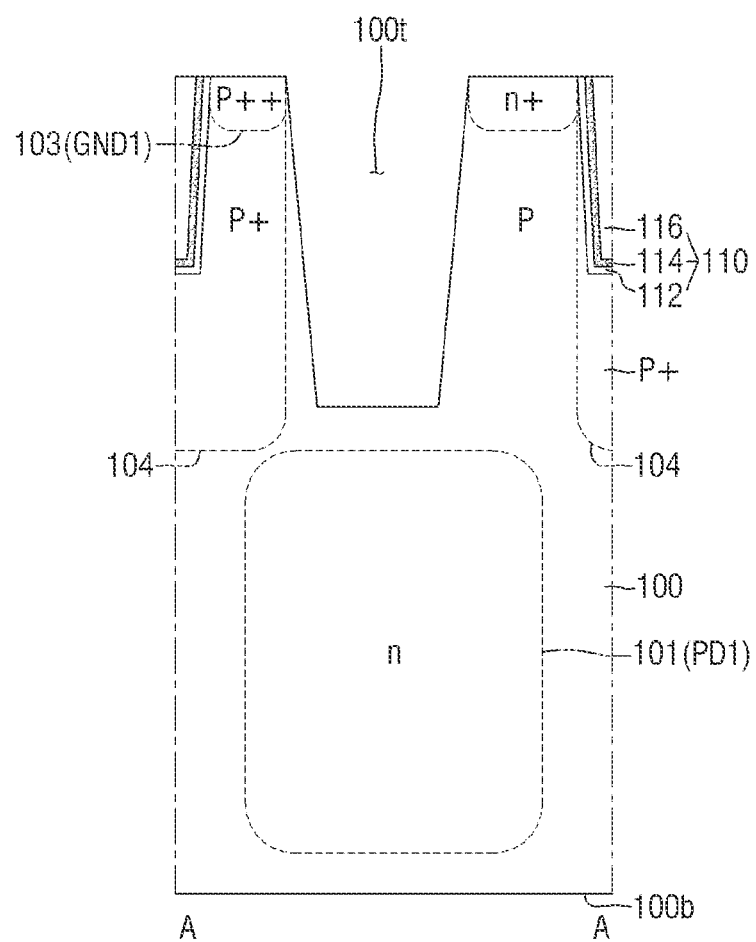

Referring to FIG. 15, a substrate trench 100t is formed in the first substrate 100.

The substrate trench 100t may extend from the first face 100a of the first substrate 100. The substrate trench 100t may be formed inside the first substrate 100 between the photoelectric conversion region 101 and the floating diffusion region FD. In an embodiment, the substrate trench 100t is adjacent to the first ground region GND1.

In an embodiment, the width of the substrate trench 100t decreases as it goes away from the first face 100a of the first substrate 100. This may be attributed to the characteristics of the etching process for forming the substrate trench 100t.

Figure 16:
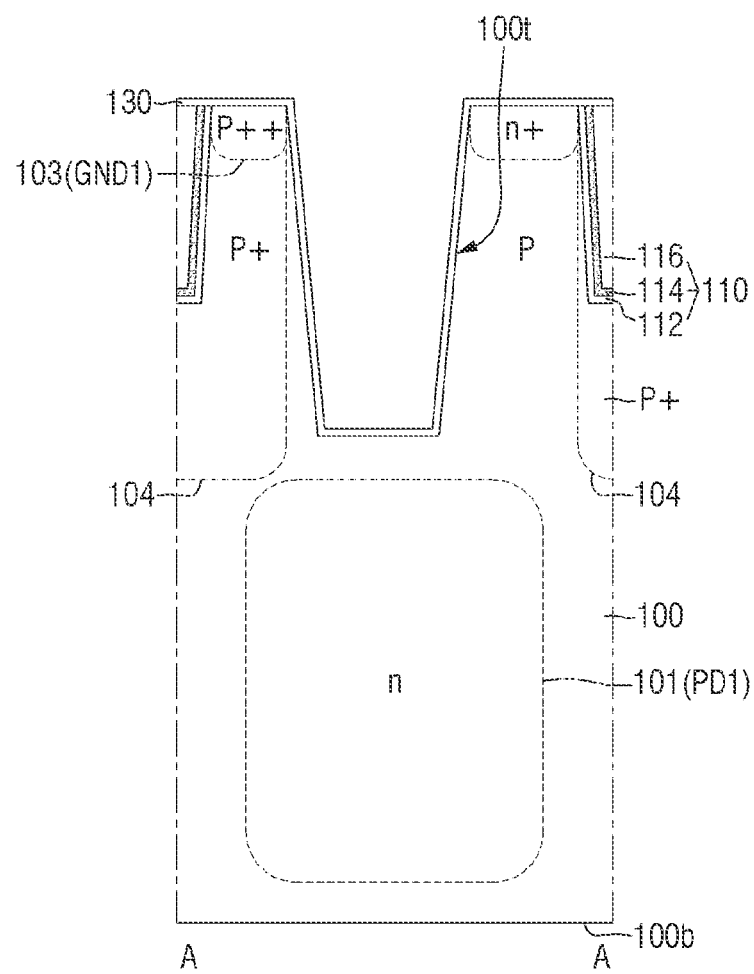

Referring to FIG. 16, a gate dielectric film 130 is formed on the first substrate 100. For example, the gate dielectric film 130 may be formed on the element separation film 110.

The gate dielectric film 130 may conformally extend along the profile of the side face and the lower face of the substrate trench 100t. In an embodiment, the gate dielectric film 130 further extends along the first face 100a of the first substrate 100. The gate dielectric film 130 may include, but is not limited to, for example, at least one of silicon oxide, silicon nitride, silicon oxynitride, and low dielectric constant (low-k) material having a lower dielectric constant than silicon oxide.

Figure 17A:
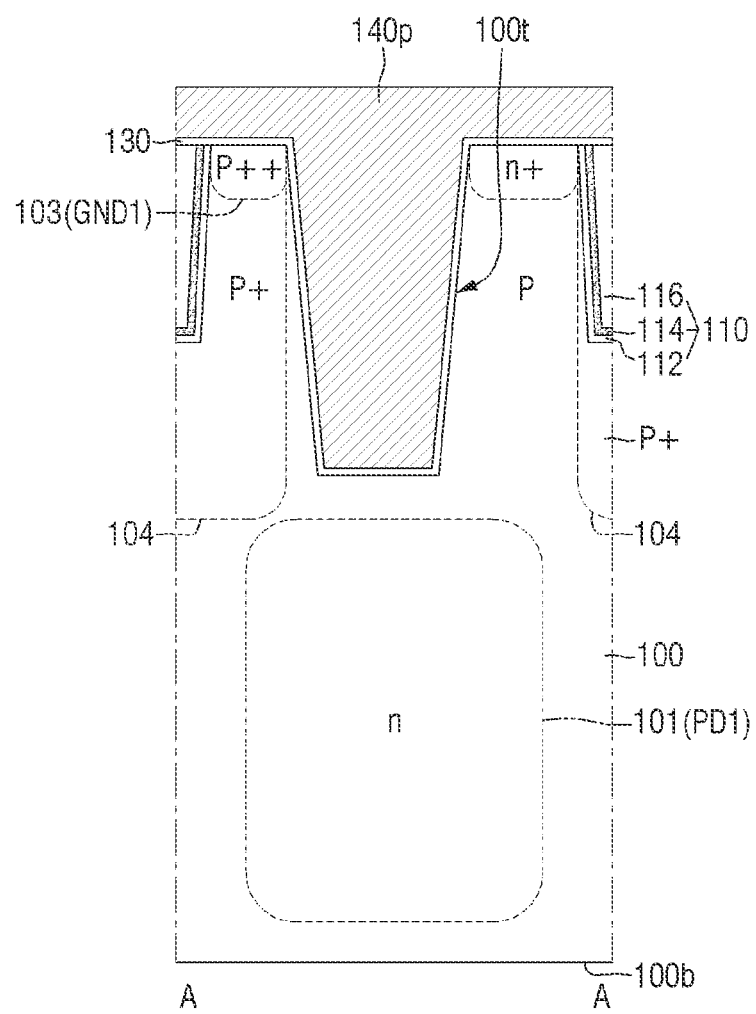

Referring to FIG. 17a, a preliminary gate conductive film 140p is formed on the gate dielectric film 130.

At least a part of the preliminary gate conductive film 140p may be formed to fill the substrate trench 100t. As a result, the lower face of the preliminary gate conductive film 140p may be formed to be lower than the first face 100a of the first substrate 100. The preliminary gate conductive film 140p may include, but is not limited to, for example, at least one of impurities-doped polysilicon (poly Si), metal silicide such as cobalt silicide, metal nitrides such as titanium nitride, and metals such as tungsten, copper and aluminum.

Figure 17B:
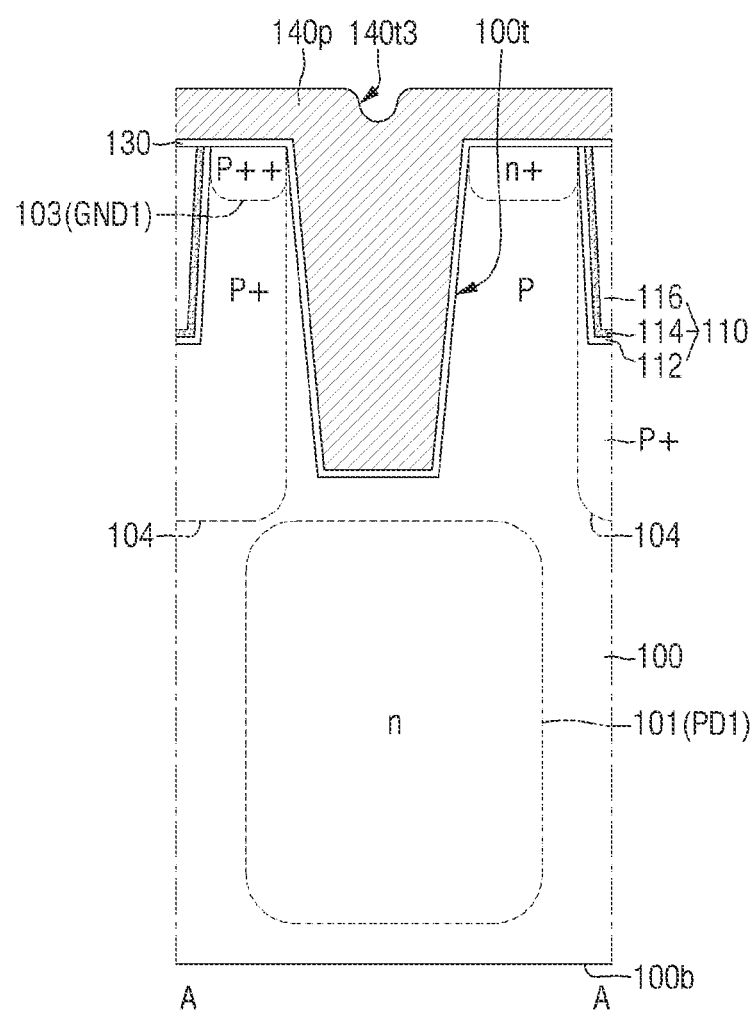

Referring to FIG. 17b, in a method for fabricating an image sensor according to an exemplary embodiment, the preliminary gate conductive film 140p may include a recess 140t3.

The recess 140t3 may be formed inside the upper face of the upper gate 144. The recess 140t3 may have a recessed shape toward the first substrate 100. This may be due to the characteristics of the deposition process for forming the preliminary gate conductive film 140p that fills the substrate trench 100t.

Figure 18A:
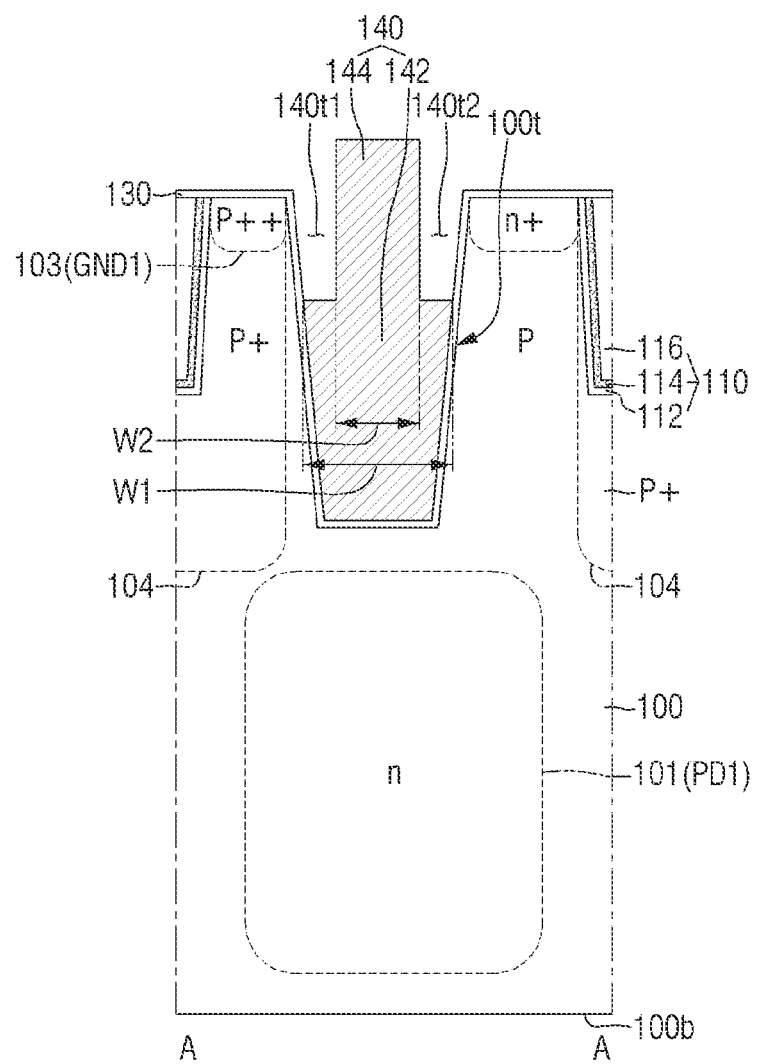

Referring to FIG. 18a, the preliminary gate conductive film 140p is patterned to form a first transfer gate 140 including a lower gate 142 and an upper gate 144. For reference, FIG. 18a is a diagram for explaining a step that occurs after FIG. 17a.

For example, a first gate trench 140t1 and a second gate trench 140t2 may be formed in the preliminary gate conductive film 140p. The first gate trench 140t1 may expose the side face of the first substrate 100 on which the first ground region GND1 is formed. The second gate trench 140t2 may expose the side face of the first substrate 100 on which the floating diffusion region FD is formed. In an embodiment, an upper gate 144 having a second width W2 smaller than the first width W1 of the lower gate 142 is formed.

Figure 18B:
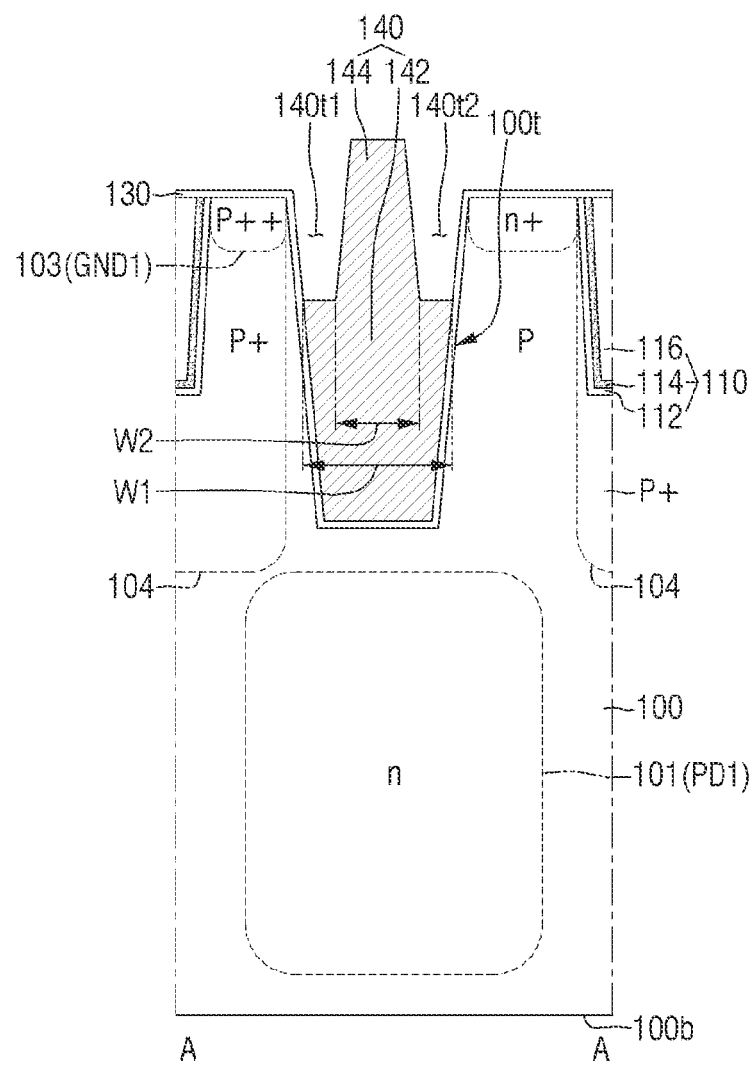

Referring to FIG. 18b, in a method for fabricating an image sensor according to an exemplary embodiment, the side face of the upper gate 144 forms an acute angle with the upper face of the lower gate 142.

For example, the second width W2 of the upper gate 144 may decrease as it goes away from the lower gate 142. This may be due to the characteristics of the etching process for forming the first gate trench 140t1 and/or the second gate trench 140t2.

Figure 18C:
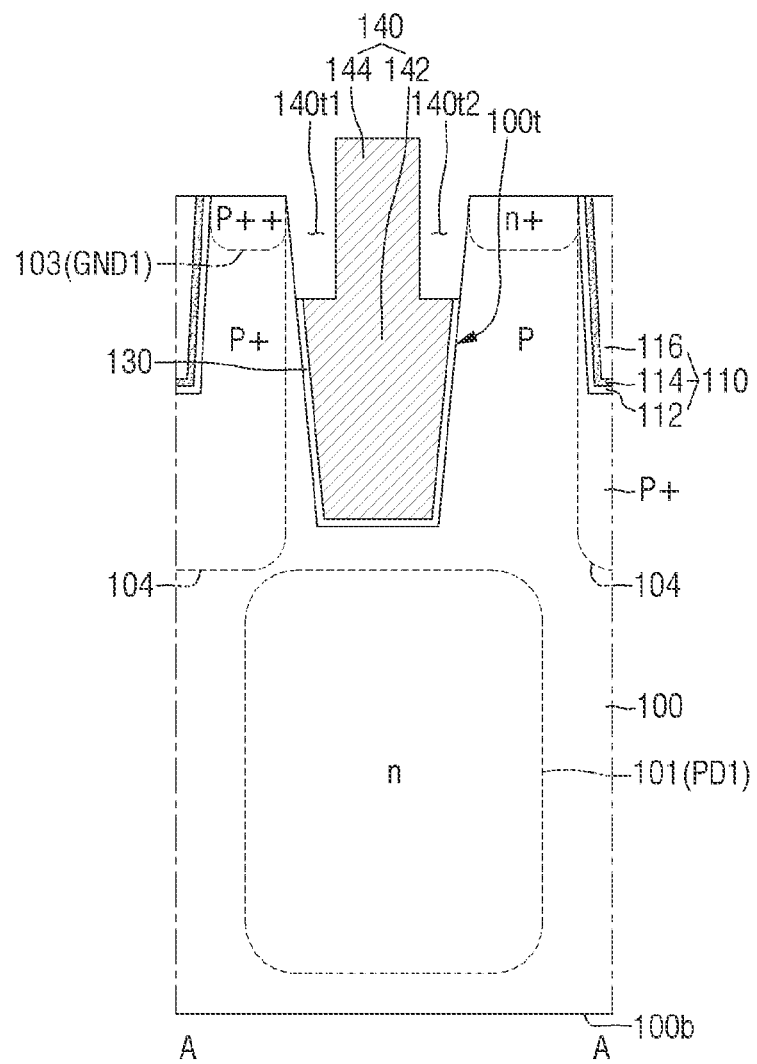

Referring to FIG. 18c, in a method for fabricating the image sensor according to an exemplary embodiment, the gate dielectric film 130 is patterned.

For example, a part of the gate dielectric film 130 may be removed by an etching process of patterning the preliminary gate conductive film 140p. The gate dielectric film 130 extending along a part of the side face of the substrate trench 100t may be formed accordingly.

Figure 19:
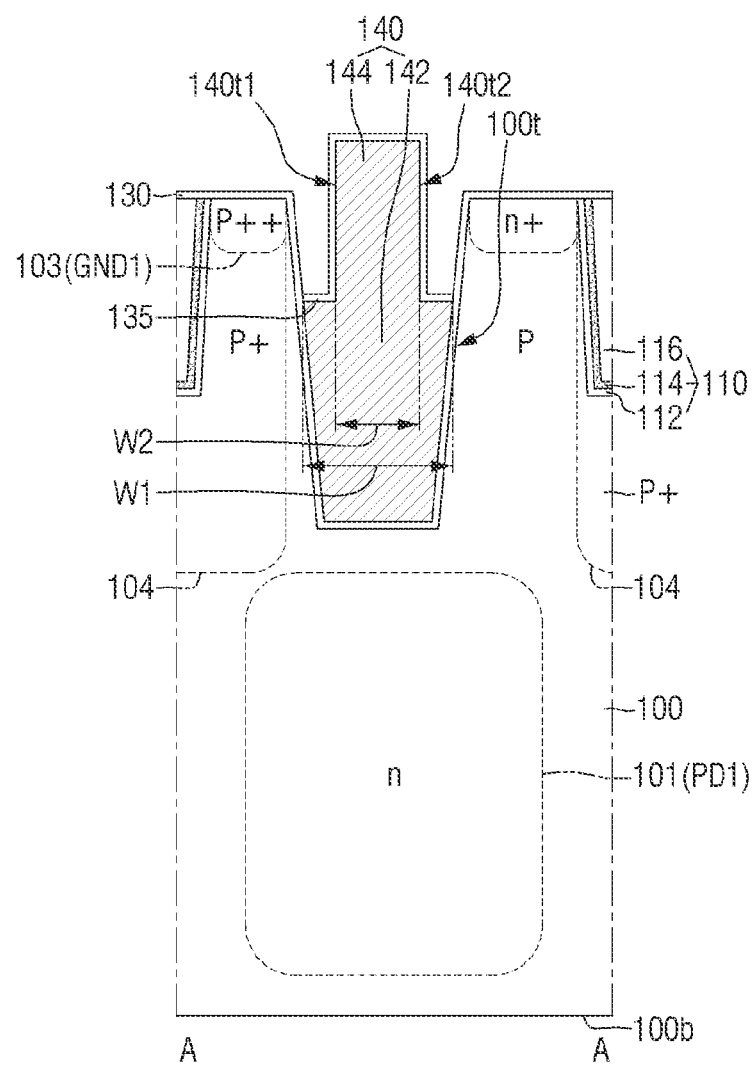

Referring to FIG. 19, a first insulating film 135 is formed on the first transfer gate 140.

The first insulating film 135 may extend conformally, for example, along the profiles of the upper face of the lower gate 142, and the side face and the upper face of the upper gate 144. In some embodiments, the first insulating film 135 may be formed by oxidizing the surface of the first transfer gate 140. As an example, the first insulating film 135 may include a silicon oxide film.

Figure 20:
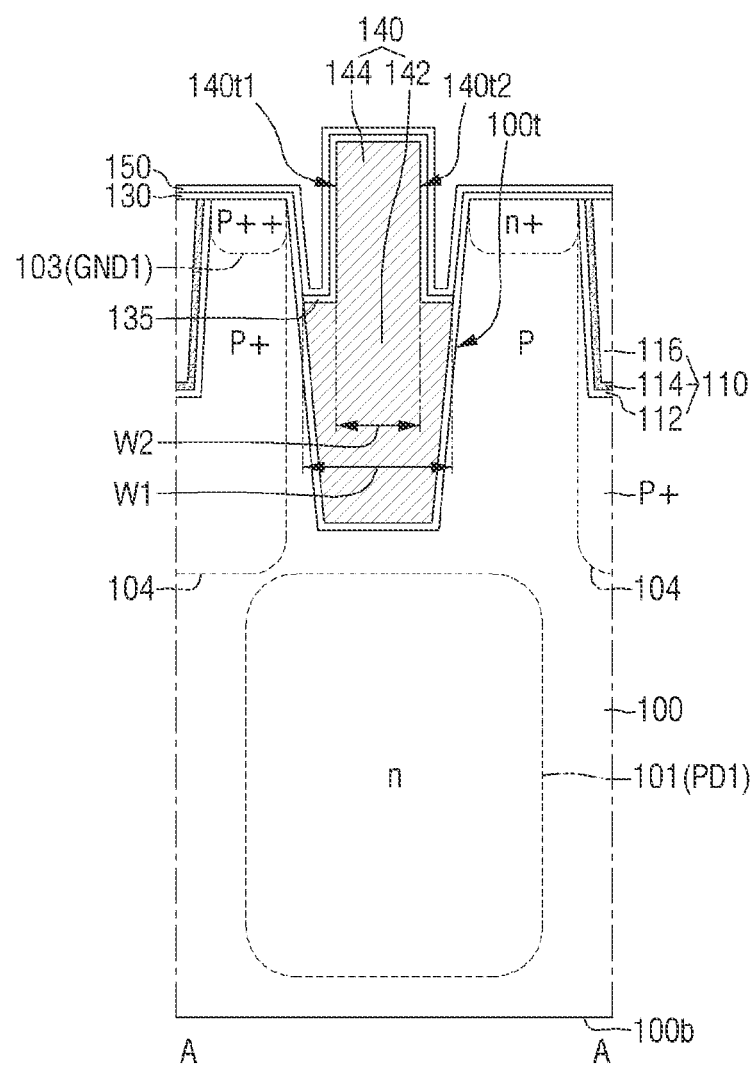

Referring to FIG. 20, a second insulating film 150 is formed on the first insulating film 135.

The second insulating film 150 may extend conformally, for example, along the profiles of the gate dielectric film 130 and the first insulating film 135. The second insulating film 150 may include, but is not limited to, for example, at least one of silicon oxide, silicon nitride, silicon oxynitride, and a low dielectric constant (low-k) material having a lower dielectric constant than silicon oxide. As an example, the second insulating film 150 may include USG (Undoped Silicate Glass).

Subsequently, referring to FIG. 4, a gate spacer 160 is formed on the second insulating film 150.

For example, a spacer film that fills the first gate trench 140t1 and/or the second gate trench 140t2 may be formed on the second insulating film 150. Subsequently, a part of the spacer film extending along the upper face of the second insulating film 150 may be removed. As a result, the gate spacer 160 that fills the first gate trench 140t1 and/or the second gate trench 140t2 may be formed on the upper face of the lower gate 142 and the side face of the upper gate 144.

The gate spacer 160 may be interposed between the first ground region GND1 and the upper gate 144. A first ground region GND1 which is separated from the upper gate 144 by the gate spacer 160 may be formed accordingly. In an embodiment, the first ground region GND1 is separated from the upper gate 144 by the gate dielectric film 130 and the gate spacer 160.

In concluding the detailed description, those of ordinary skill in the art will appreciate that many variations and modifications may be made to these embodiments without substantially departing from the principles of the present inventive concept.

What is claimed is:
1. An image sensor comprising:
a substrate;

a photoelectric conversion region disposed inside the substrate;
a first active region disposed inside the substrate, the first active region including a ground region, a floating diffusion region, and a channel region connecting the ground region and the floating diffusion region;
a substrate trench disposed inside the channel region;
a transfer gate disposed on a face of the substrate, the transfer gate including a lower gate which fills a part of the substrate trench and has a first width, and an upper gate disposed on the lower gate, the upper gate having a second width smaller than the first width;
a gate spacer disposed inside the substrate trench, the gate spacer interposed between the ground region and the upper gate; and
a gate dielectric film interposed between the ground region and the gate spacer.

2. The image sensor of claim 1, wherein the ground region and the channel region include impurities of a first conductive type, and the photoelectric conversion region and the floating diffusion region include impurities of a second conductive type different from the first conductive type.

3. The image sensor of claim 2, wherein an impurity concentration of the ground region is higher than an impurity concentration of the channel region.

4. The image sensor of claim 2, further comprising: a well region disposed inside the substrate, the well region surrounding the channel region and including impurities of the first conductive type.

5. The image sensor of claim 4, wherein an impurity concentration of the well region is higher than an impurity concentration of the channel region and is lower than an impurity concentration of the ground region.

6. The image sensor of claim 1, wherein the first width of the lower gate decreases as it goes away from the upper gate.

7. The image sensor of claim 1, wherein the second width of the upper gate decreases as it goes away from the lower gate.

8. The image sensor of claim 1, wherein an upper face of the upper gate includes a recess.

9. The image sensor of claim 1, further comprising: an element separation film disposed inside the substrate to surround the first active region without being interposed between the ground region and the channel region.

10. An image sensor comprising:
a substrate;
a photoelectric conversion region disposed inside the substrate;
a first active region disposed inside the substrate, the first active region including a ground region and a channel region;
an element separation film disposed inside the substrate to surround the first active region without being interposed between the ground region and the channel region;
a substrate trench disposed in the channel region;
a transfer gate which fills at least a part of the substrate trench;
a first gate trench disposed inside the transfer gate and adjacent to the ground region; and
a gate spacer disposed inside the first gate trench,
wherein the element separation film comprises first and second insulating layers and an etching blocking liner disposed therebetween to have an etch selectivity with respect to the first and second insulating layers.

11. The image sensor of claim 10, the first active region further includes a floating diffusion region separate from the ground region, wherein the channel region connects the ground region and the floating diffusion region.

12. The image sensor of claim 11, further comprising:
a second gate trench disposed inside the transfer gate and adjacent to the floating diffusion region, wherein the gate spacer is located inside the first gate trench and the second gate trench.

13. The image sensor of claim 10, further comprising: a first insulating film extending along an upper face of the transfer gate.

14. The image sensor of claim 13, further comprising:
a second insulating film extending along an upper face of the substrate and the upper face of the transfer gate, between the first insulating film and the gate spacer.

15. An image sensor comprising:
a substrate;
a photoelectric conversion region disposed inside the substrate;
a first active region disposed inside the substrate, the first active region including a ground region, a floating diffusion region, and a channel region for connecting the ground region and the floating diffusion region;
a second active region disposed inside the substrate to be separate from the first active region;
an element separation film disposed inside the substrate to separate the first active region and the second active region;
a transfer gate disposed on the channel region, the transfer gate including a lower gate buried in the substrate and having a first width, and an upper gate disposed on the lower gate and having a second width smaller than the first width;
a gate dielectric film interposed between the channel region and the transfer gate; and
a gate spacer which extends along a side face of the upper gate,
wherein the gate dielectric film is interposed between the ground region and the gate spacer.

16. The image sensor of claim 15, further comprising: a source follower gate disposed on the second active region to connect to the floating diffusion region.

17. The image sensor of claim 15, further comprising: a reset gate disposed on the second active region to connect to the floating diffusion region.

18. The image sensor of claim 15, wherein the substrate includes a first face adjacent to the transfer gate, and a second face that opposes the first face and on which light is incident.

19. The image sensor of claim 18, further comprising:
an inter-wiring insulating film disposed on the first face of the substrate to cover the substrate;
a wiring disposed in the inter-wiring insulating film; and
a ground contact disposed inside the inter-wiring insulating film to connect the ground region and the wiring.

20. The image sensor of claim 19, wherein a ground voltage is applied to the ground region through the ground contact.

* * * * *